United States Patent
Konishi et al.

(10) Patent No.: US 11,133,453 B2
(45) Date of Patent: Sep. 28, 2021

(54) PIEZOELECTRIC DRIVING DEVICE, PIEZOELECTRIC MOTOR, ROBOT, ELECTRONIC-COMPONENT CONVEYING APPARATUS, PRINTER, AND PROJECTOR

(71) Applicant: Seiko Epson Corporation, Tokyo (JP)

(72) Inventors: Akio Konishi, Matsumoto (JP); Kiichi Kajino, Matsumoto (JP)

(73) Assignee: Seiko Epson Corporation

( * ) Notice: Subject to any disclaimer, the term of this patent is extended or adjusted under 35 U.S.C. 154(b) by 559 days.

(21) Appl. No.: 16/137,611

(22) Filed: Sep. 21, 2018

(65) Prior Publication Data

US 2019/0097120 A1    Mar. 28, 2019

(30) Foreign Application Priority Data

Sep. 22, 2017    (JP) .............................. JP2017-182640

(51) Int. Cl.

| | |
|---|---|
| H01L 41/047 | (2006.01) |
| H02N 2/10 | (2006.01) |
| H01L 41/053 | (2006.01) |
| H01L 41/08 | (2006.01) |
| G03B 21/14 | (2006.01) |
| B41J 2/14 | (2006.01) |
| B25J 9/00 | (2006.01) |
| B65G 23/00 | (2006.01) |
| H01L 21/677 | (2006.01) |
| B41J 13/03 | (2006.01) |
| B41J 29/38 | (2006.01) |

(Continued)

(52) U.S. Cl.
CPC ........ *H01L 41/0475* (2013.01); *B25J 9/0009* (2013.01); *B41J 2/14201* (2013.01); *B41J 13/03* (2013.01); *B41J 29/38* (2013.01); *B65G 23/00* (2013.01); *G03B 21/142* (2013.01); *H01L 21/67706* (2013.01); *H01L 41/053* (2013.01); *H01L 41/0825* (2013.01); *H02N 2/103* (2013.01); *G03B 21/53* (2013.01); *G03B 33/12* (2013.01)

(58) Field of Classification Search
CPC ............... H01L 41/047; H01L 41/0475; H01L 41/0825; H01L 41/053
USPC ....................................... 310/323.01–323.21
See application file for complete search history.

(56) References Cited

U.S. PATENT DOCUMENTS

| | | | |
|---|---|---|---|
| 2007/0188048 A1* | 8/2007 | Nagahama ............... | G04C 3/12 310/316.01 |
| 2016/0049574 A1* | 2/2016 | Iwazaki ................... | H02N 2/14 74/490.05 |
| 2017/0001306 A1 | 1/2017 | Arakawa et al. | |

FOREIGN PATENT DOCUMENTS

JP    2017-017916 A    1/2017

* cited by examiner

*Primary Examiner* — Derek J Rosenau
(74) *Attorney, Agent, or Firm* — Harness, Dickey & Pierce, P.L.C.

(57) ABSTRACT

A piezoelectric driving device includes a substrate, a first insulating film disposed on the substrate, a piezoelectric element for driving disposed on the first insulating film and configured to vibrate the substrate, a piezoelectric element for detection configured to detect the vibration of the substrate, a wire for driving electrically connected to the piezoelectric element for driving, a wire for detection electrically connected to the piezoelectric element for detection, and a lower layer wire disposed between the first insulating film and the substrate and set to fixed potential. At least one of the wire for driving and the wire for detection overlaps at least a part of the lower layer wire.

20 Claims, 21 Drawing Sheets

(51) Int. Cl.
*G03B 33/12* (2006.01)
*G03B 21/53* (2006.01)

PIEZOELECTRIC DRIVING DEVICE, PIEZOELECTRIC MOTOR, ROBOT, ELECTRONIC-COMPONENT CONVEYING APPARATUS, PRINTER, AND PROJECTOR

BACKGROUND

1. Technical Field

The present invention relates to a piezoelectric driving device, a piezoelectric motor, a robot, an electronic-component conveying apparatus, a printer, and a projector.

2. Related Art

As a piezoelectric driving device, there has been known a configuration of the piezoelectric driving device described in JP-A-2017-17916 (Patent Literature 1). The piezoelectric driving device described in Patent Literature 1 includes a silicon substrate including a vibrating section and a supporting section that supports a vibrating section. A piezoelectric element for driving is disposed in the vibrating section. A wire for driving electrically connected to the piezoelectric element for driving is disposed in the supporting section.

In order to detect a vibration state of the vibrating section, in some case, a piezoelectric element for detection is provided in the vibrating section separately from the piezoelectric element for driving and a wire for detection electrically connected to the piezoelectric element for detection is provided in the supporting section. In this case, it is likely that the wire for driving and the wire for detection are capacitively coupled via the supporting section (the silicon substrate) and a signal for driving applied to the wire for driving intrudes into the wire for detection as noise. Therefore, it is likely that a detection signal cannot be accurately acquired and the vibration state of the vibrating section cannot be accurately detected.

SUMMARY

An advantage of some aspects of the invention is to provide a piezoelectric driving device that can accurately detect a vibration state and a piezoelectric motor, a robot, an electronic-component conveying apparatus, a printer, and a projector including the piezoelectric driving device and having high reliability.

The advantage can be achieved by the following configurations.

A piezoelectric driving device according to an aspect of the invention includes: a substrate; a first insulating film disposed above one surface of the substrate; a piezoelectric element for driving disposed above the first insulating film and configured to vibrate the substrate; a piezoelectric element for detection disposed above the first insulating film and configured to detect the vibration of the substrate; a wire for driving disposed above the first insulating film and electrically connected to the piezoelectric element for driving; a wire for detection disposed above the first insulating film and electrically connected to the piezoelectric element for detection; and a lower layer wire disposed between the first insulating film and the substrate and set to fixed potential. At least one of the wire for driving and the wire for detection overlaps the lower layer wire in a plan view of the substrate.

With this configuration, capacitive coupling of the wire for driving and the wire for detection via the substrate can be prevented. Therefore, noise from the wire for driving is less easily mixed in the wire for detection. A vibration state of the substrate can be accurately detected.

In the piezoelectric driving device according to the aspect of the invention, it is preferable that the wire for driving overlaps the lower layer wire in the plan view of the substrate.

With this configuration, the capacitive coupling of the wire for driving and the wire for detection via the substrate can be more surely prevented.

In the piezoelectric driving device according to the aspect of the invention, it is preferable that the lower layer wire includes a portion projecting to an outer side from a contour of the wire for driving in the plan view of the substrate.

With this configuration, for example, positional deviation between the lower layer wire and the wire for driving can be allowed. The lower layer wire can be more surely disposed to overlap the wire for driving.

In the piezoelectric driving device according to the aspect of the invention, it is preferable that the wire for detection does not overlap the lower layer wire in the plan view of the substrate.

With this configuration, attenuation of a detection signal obtained from the wire for detection is reduced and a detection signal having higher intensity is obtained. Therefore, the vibration state of the substrate can be more accurately detected.

In the piezoelectric driving device according to the aspect of the invention, it is preferable that width of the wire for detection is smaller than width of the wire for driving.

With this configuration, the wire for detection is sufficiently thin. Parasitic capacitance coupled to the wire for detection can be reduced. The wire for driving is sufficiently thick. The resistance of the wire for driving can be set to sufficiently low.

In the piezoelectric driving device according to the aspect of the invention, it is preferable that the piezoelectric driving device further includes a second insulating film disposed between the substrate and the lower layer wire.

With this configuration, the lower layer wire can be more surely insulated from the substrate.

In the piezoelectric driving device according to the aspect of the invention, it is preferable that the substrate is a silicon substrate.

With this configuration, the substrate can be formed at high dimension accuracy by etching or the like.

In the piezoelectric driving device according to the aspect of the invention, it is preferable that the lower layer wire is connected to a ground.

With this configuration, a device configuration is simplified.

In the piezoelectric driving device according to the aspect of the invention, it is preferable that the substrate includes vibrating sections and supporting sections configured to support the vibrating sections, and the piezoelectric element for driving and the piezoelectric element for detection are respectively disposed in the vibrating sections.

With this configuration, the vibrating sections can be efficiently vibrated. The vibration state of the vibrating sections can be accurately detected.

A piezoelectric motor according to another aspect of the invention includes: the piezoelectric driving device according to the aspect of the invention; and a driven section that is in contact with the piezoelectric driving device.

With this configuration, the piezoelectric motor can enjoy the effects of the piezoelectric driving device according to the aspect of the invention. The piezoelectric motor having high reliability is obtained.

A robot according to another aspect of the invention includes the piezoelectric driving device according to the aspect of the invention.

With this configuration, the robot can enjoy the effects of the piezoelectric driving device according to the aspect of the invention. The robot having high reliability is obtained.

An electronic-component conveying apparatus according to another aspect of the invention includes the piezoelectric driving device according to the aspect of the invention.

With this configuration, the electronic-component conveying apparatus can enjoy the effects of the piezoelectric driving device according to the aspect of the invention. The electronic-component conveying apparatus having high reliability is obtained.

A printer according to another aspect of the invention includes the piezoelectric driving device according to the aspect of the invention.

With this configuration, the printer can enjoy the effects of the piezoelectric driving device according to the aspect of the invention. The printer having high reliability is obtained.

A projector according to another aspect of the invention includes the piezoelectric driving device according to the aspect of the invention.

With this configuration, the projector can enjoy the effects of the piezoelectric driving device according to the aspect of the invention. The projector having high reliability is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of a piezoelectric driving device, a piezoelectric motor, a robot, an electronic-component conveying apparatus, a printer and a projector according to the invention are explained below in detail with reference to the accompanying drawings.

First Embodiment

First, a piezoelectric motor according to a first embodiment of the invention is explained.

Figure 1:
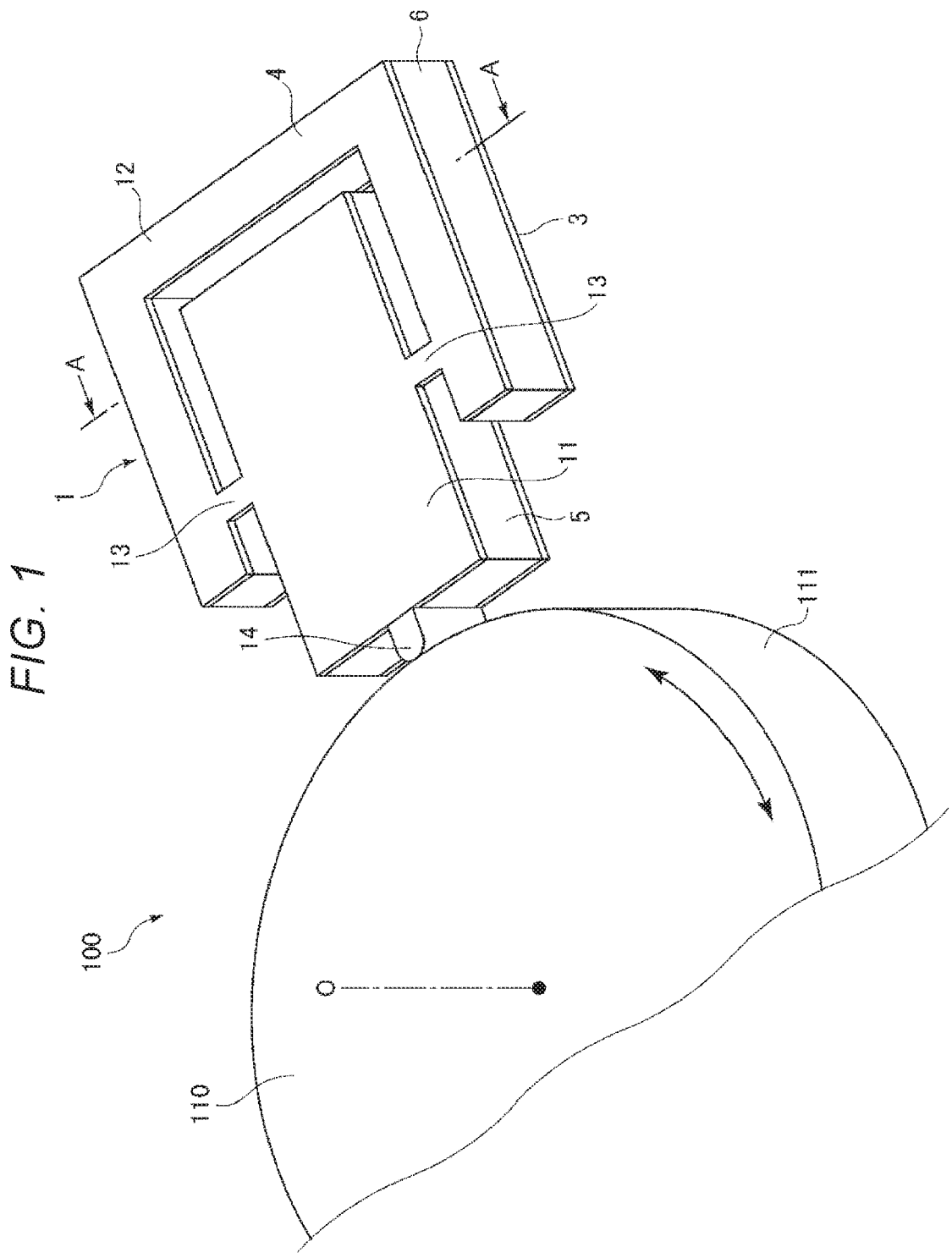
FIG. 1 is a perspective view showing an overall configuration of a piezoelectric motor according to a first embodiment of the invention.
Figure 2:
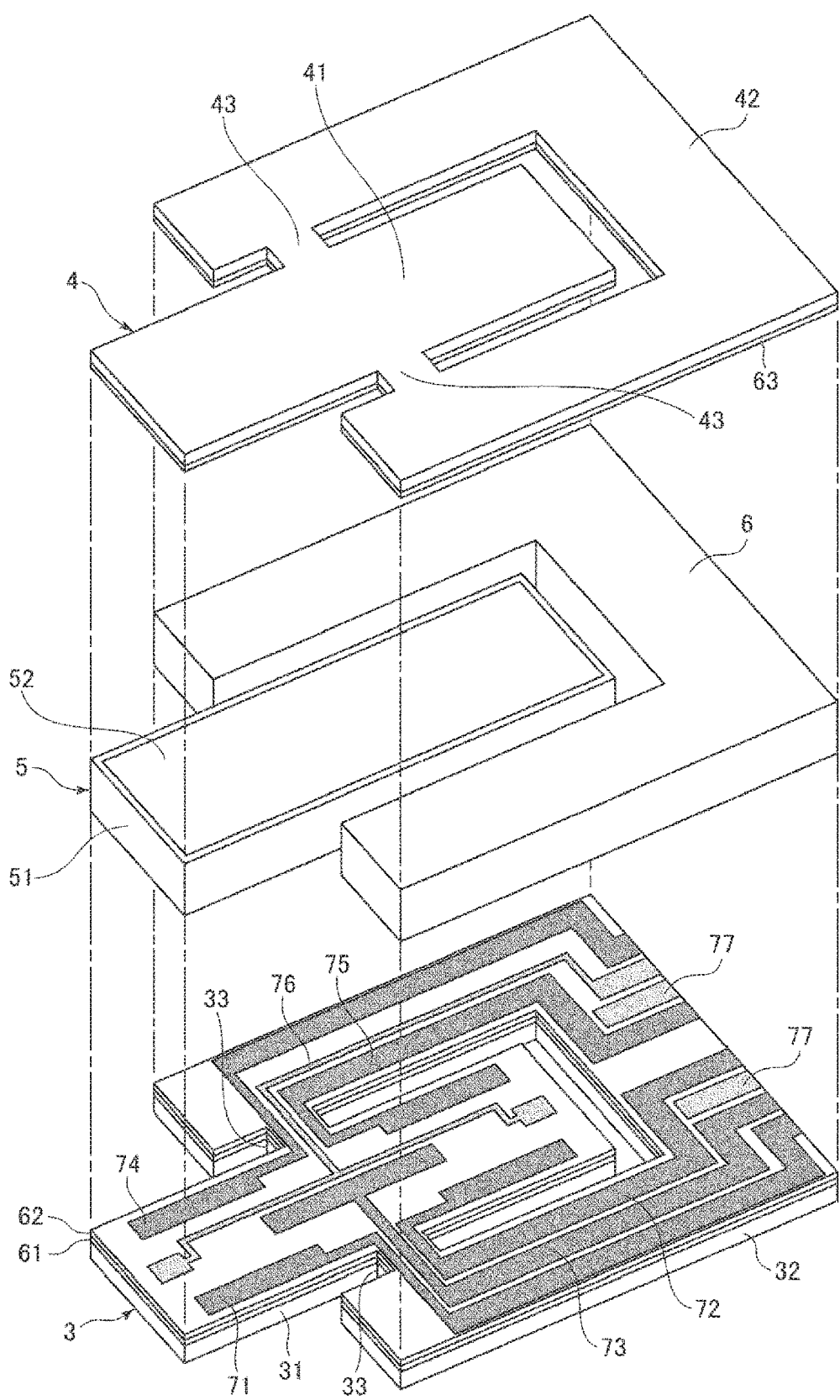
FIG. 2 is an exploded perspective view of a piezoelectric driving device shown in FIG. 1.
Figure 3:
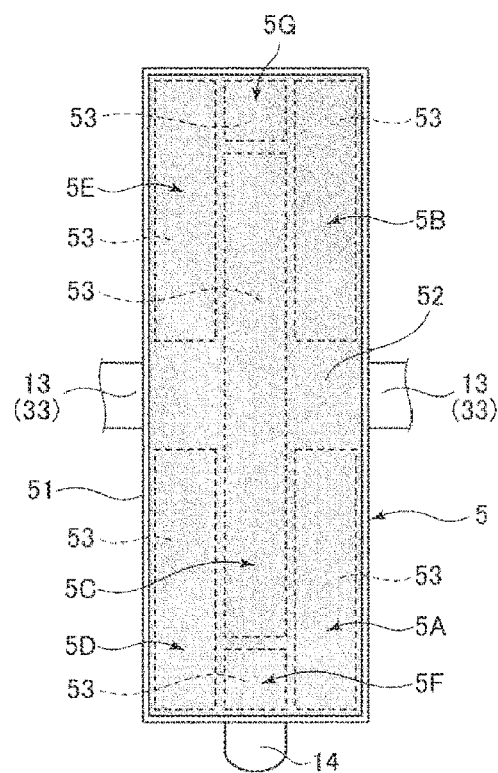
FIG. 3 is a view of a piezoelectric element included in the piezoelectric driving device shown in FIG. 1 viewed from a second substrate side.
Figure 4:
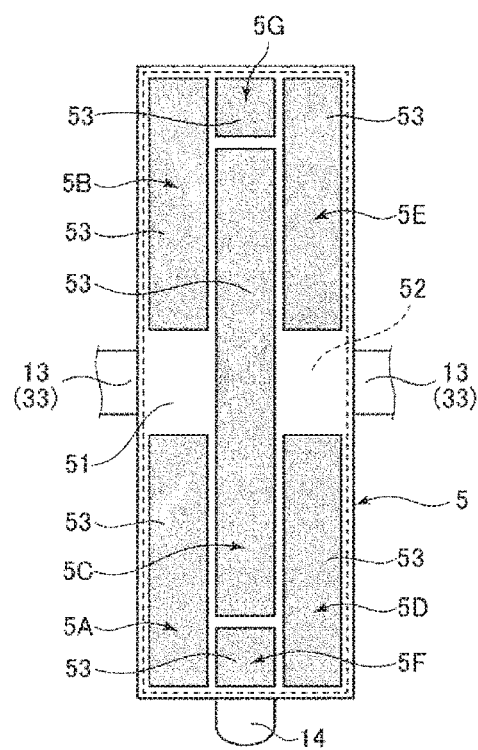
FIG. 4 is a view of the piezoelectric element viewed from a first substrate side.
Figure 5:
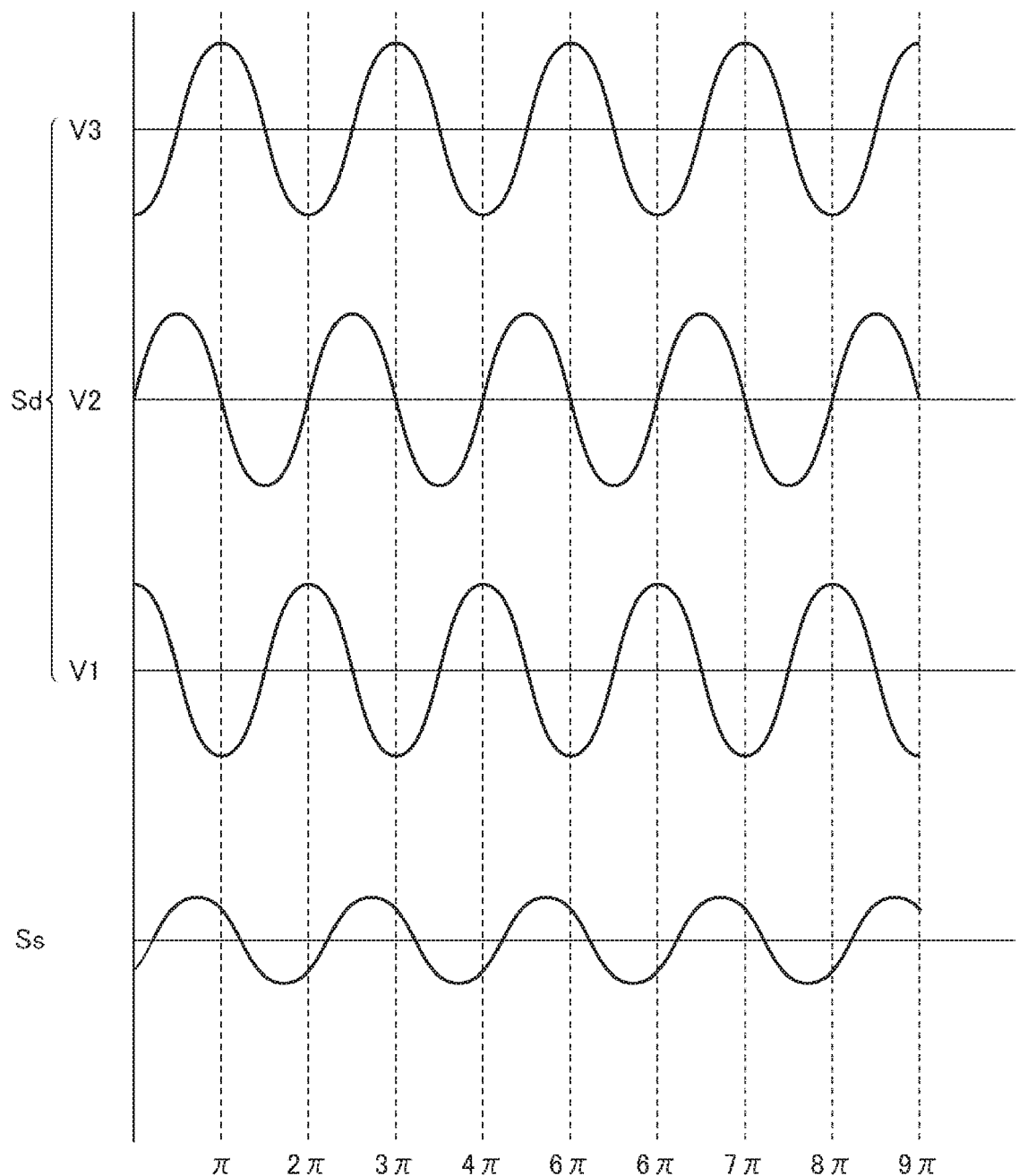
FIG. 5 is a diagram showing a voltage applied to the piezoelectric driving device.
Figure 6:
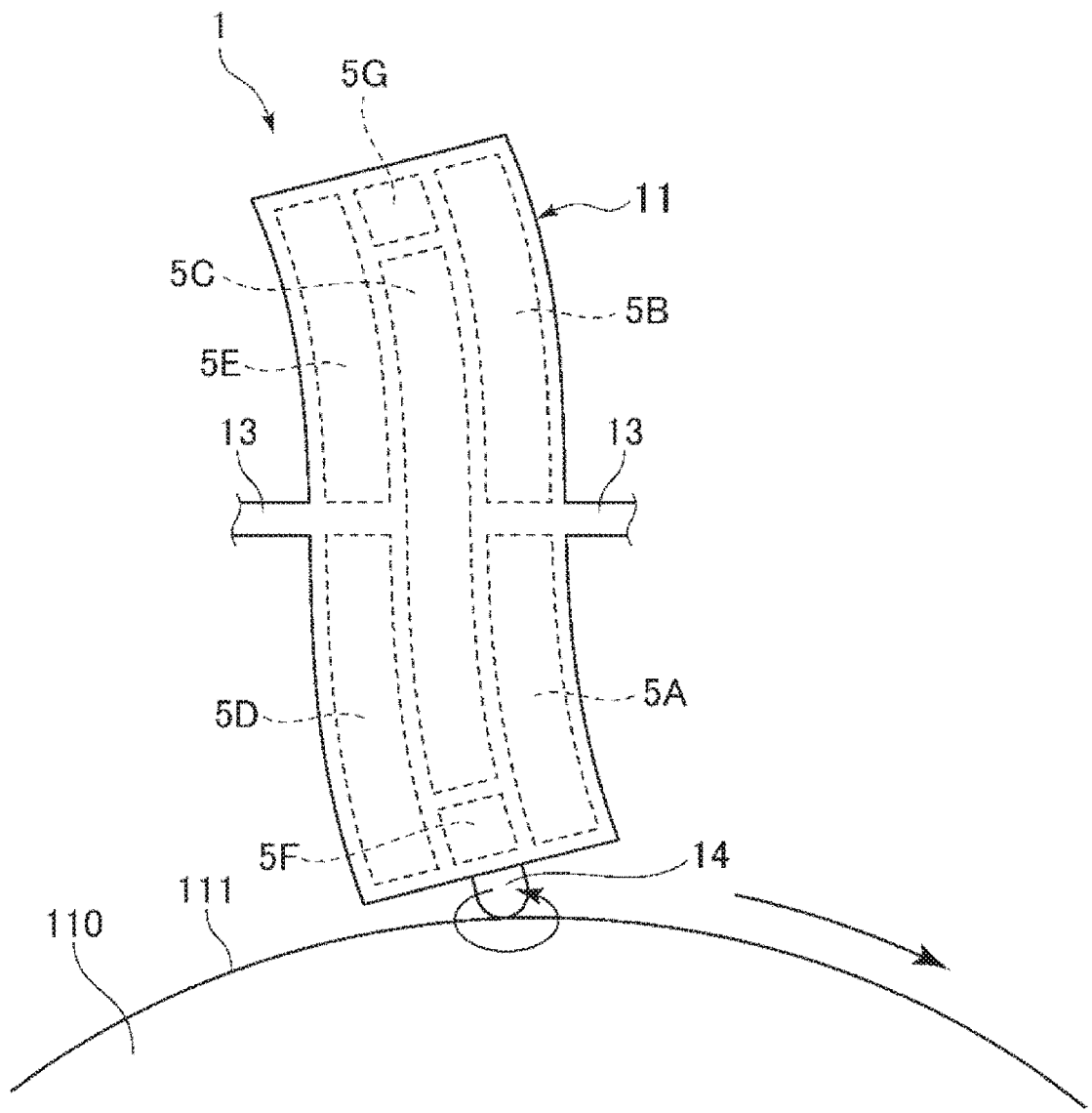
FIG. 6 is a diagram showing driving of the piezoelectric motor at the time when the voltage shown in FIG. 5 is applied.
Figure 7:
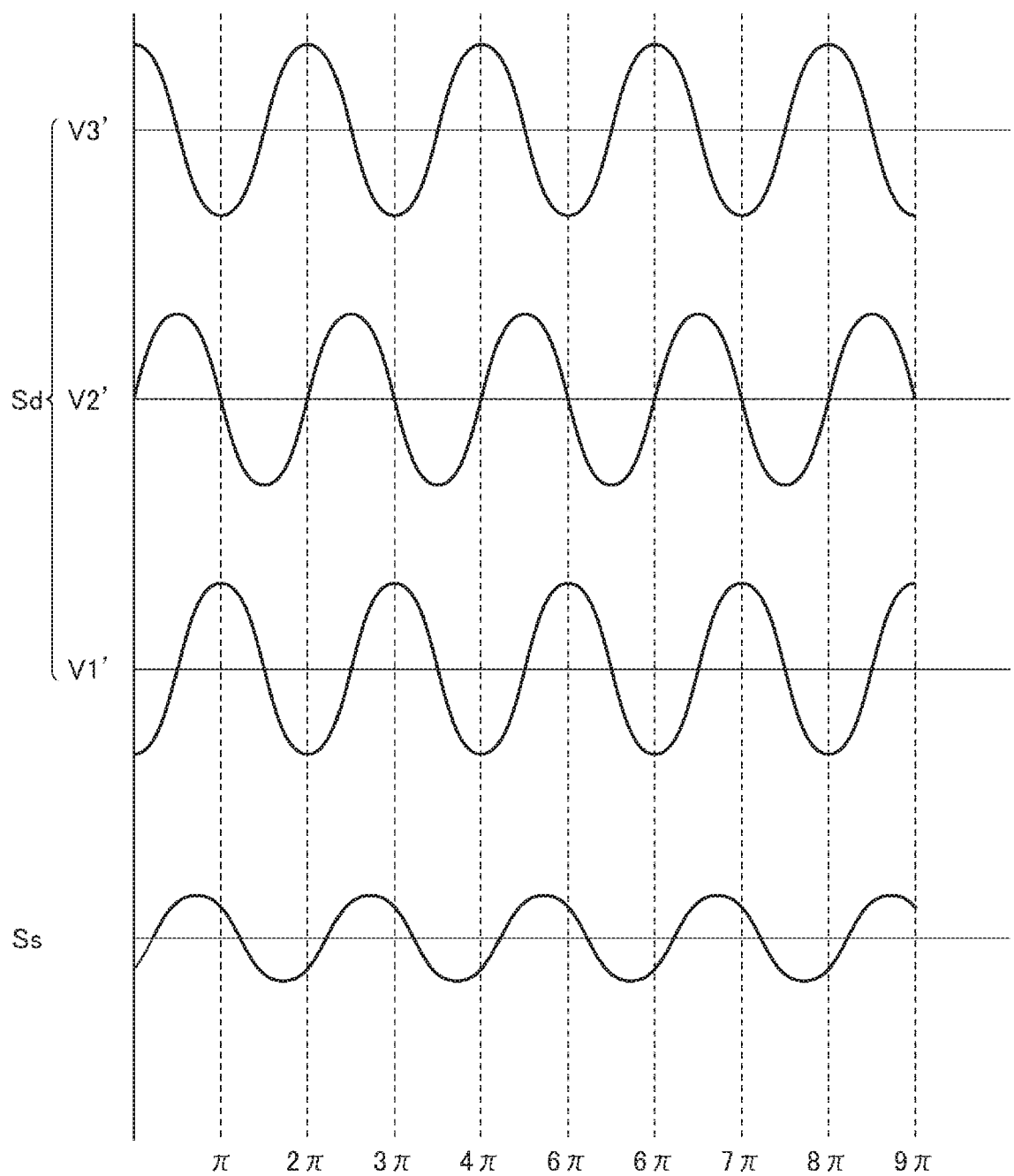
FIG. 7 is a diagram showing a voltage applied to the piezoelectric driving device.
Figure 8:
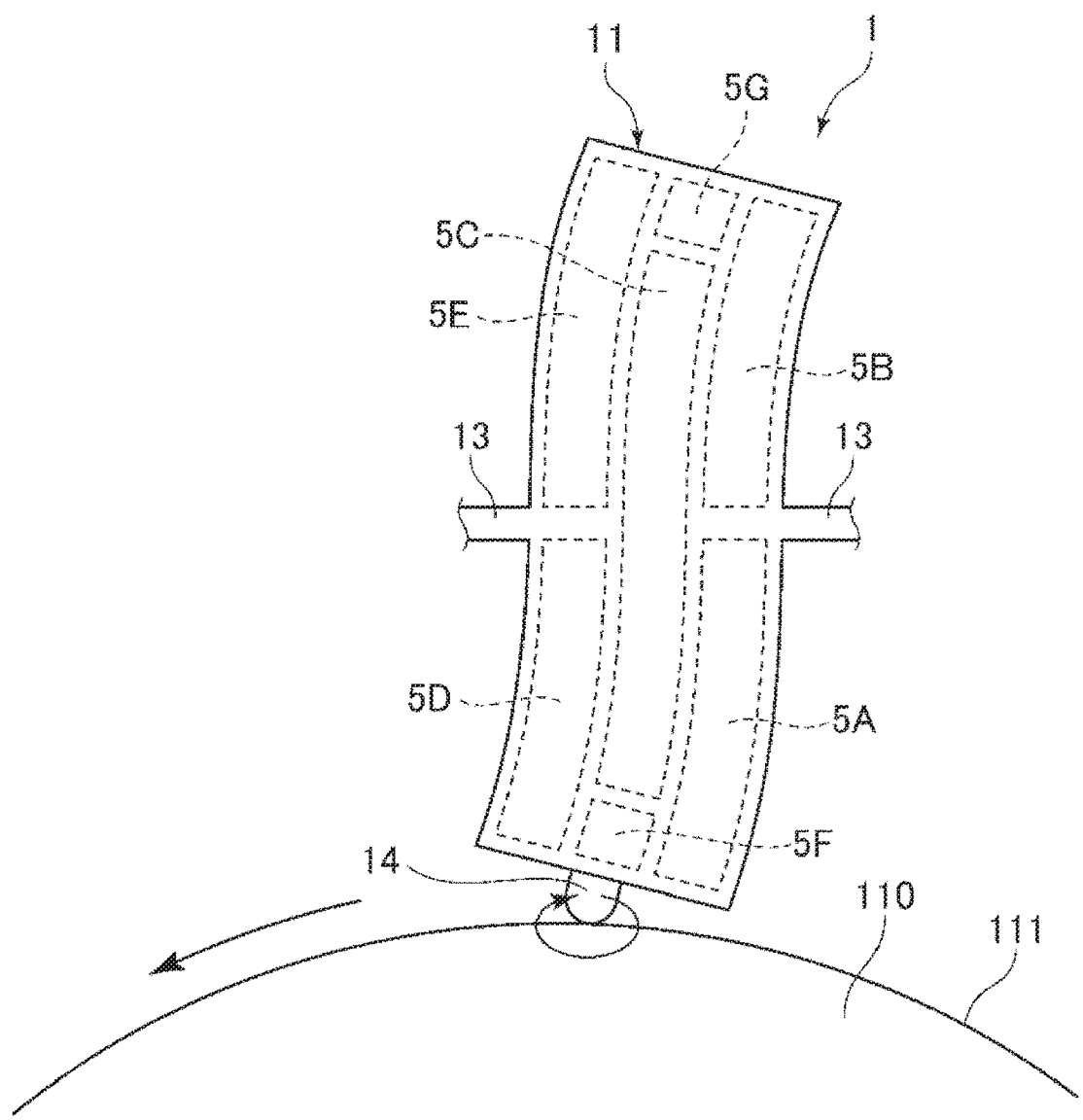
FIG. 8 is a diagram showing driving of the piezoelectric motor at the time when the voltage shown in FIG. 7 is applied.
Figure 9:
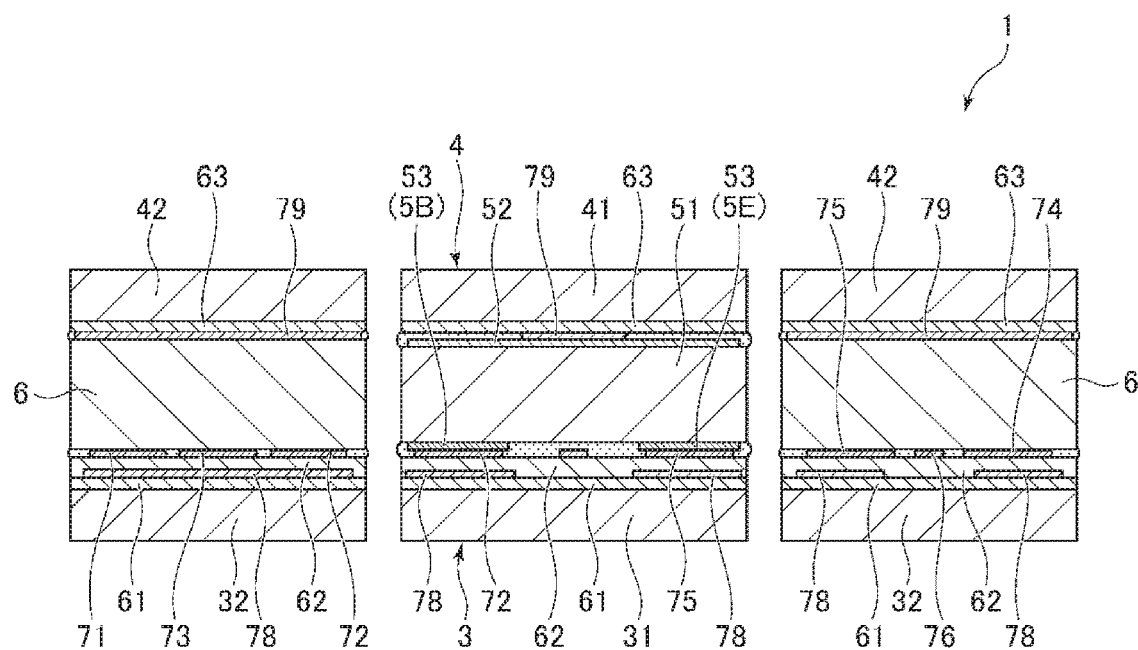
FIG. 9 is an A-A line sectional view in FIG. 1.
Figure 10:
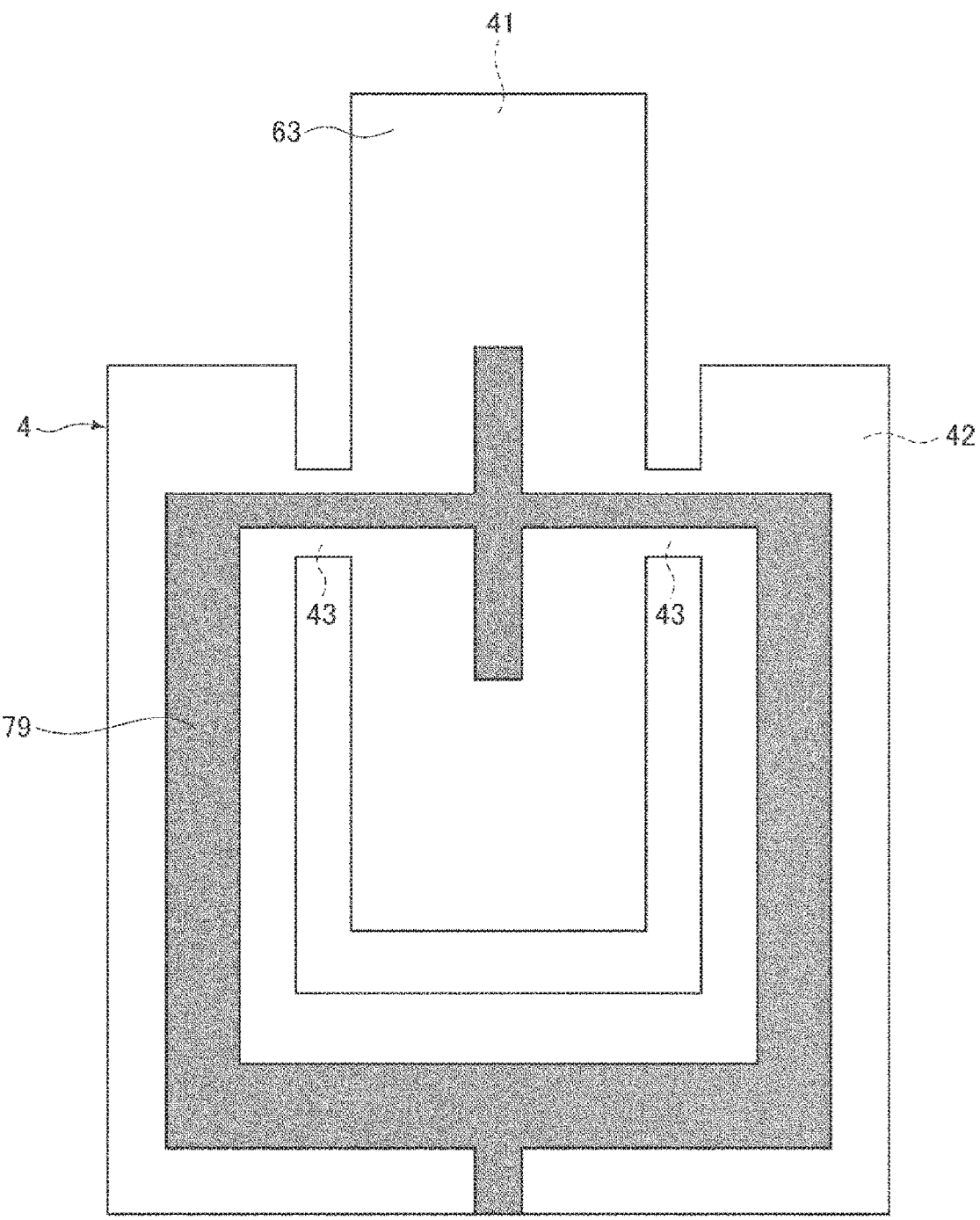
FIG. 10 is a diagram showing a GND wire.
Figure 11:
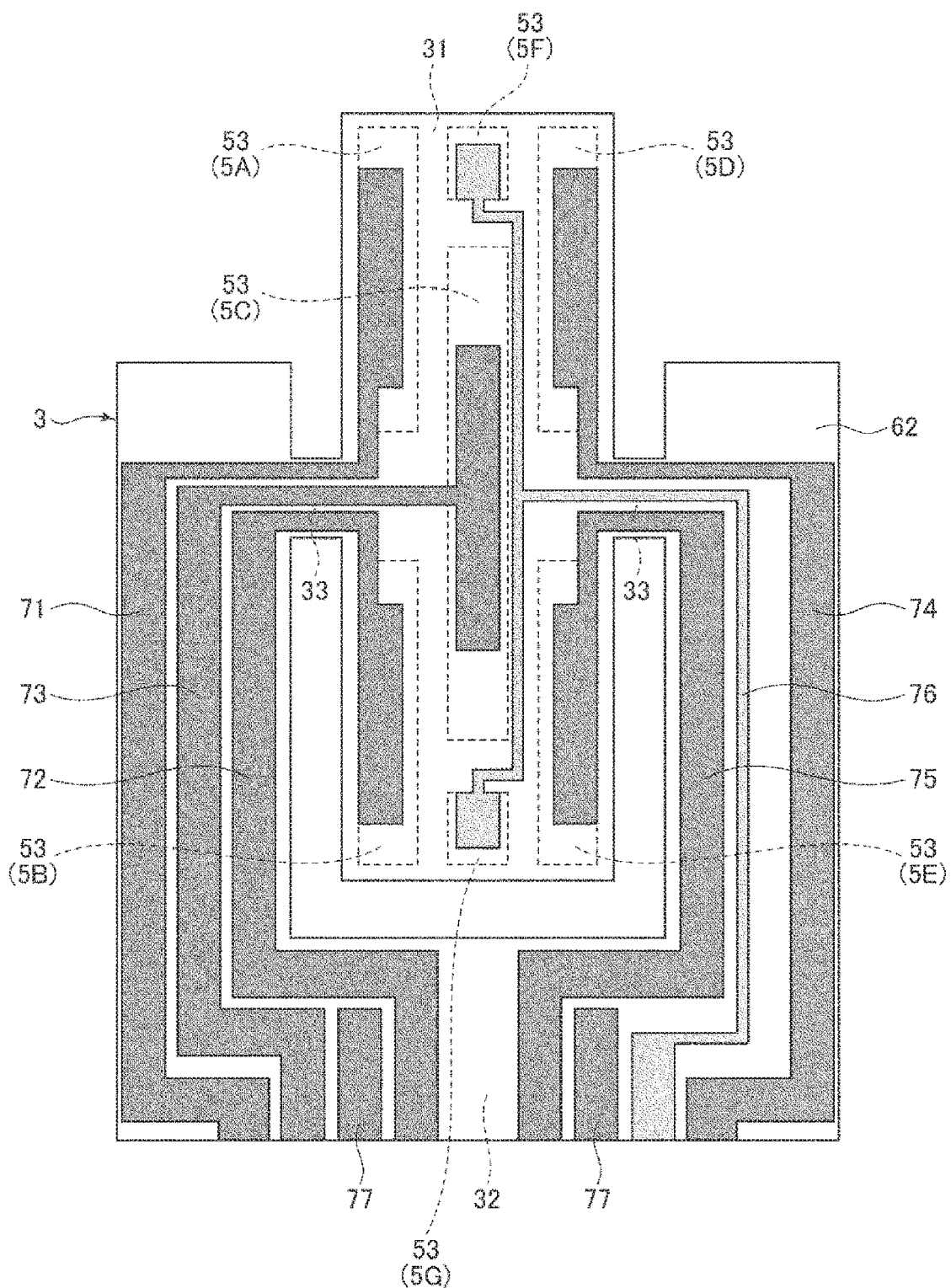
FIG. 11 is a diagram showing a wire for driving and a wire for detection.
Figure 12:
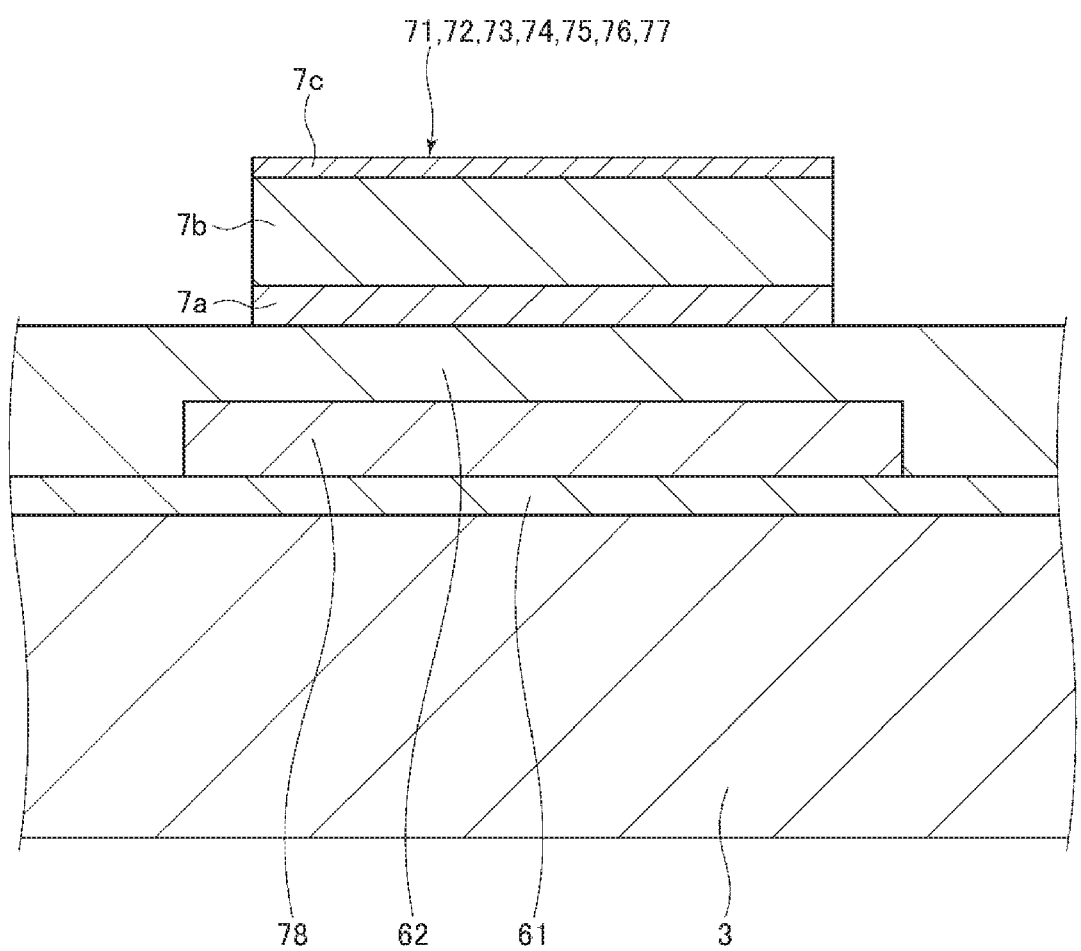
FIG. 12 is a schematic sectional view showing a wiring structure.
Figure 13:
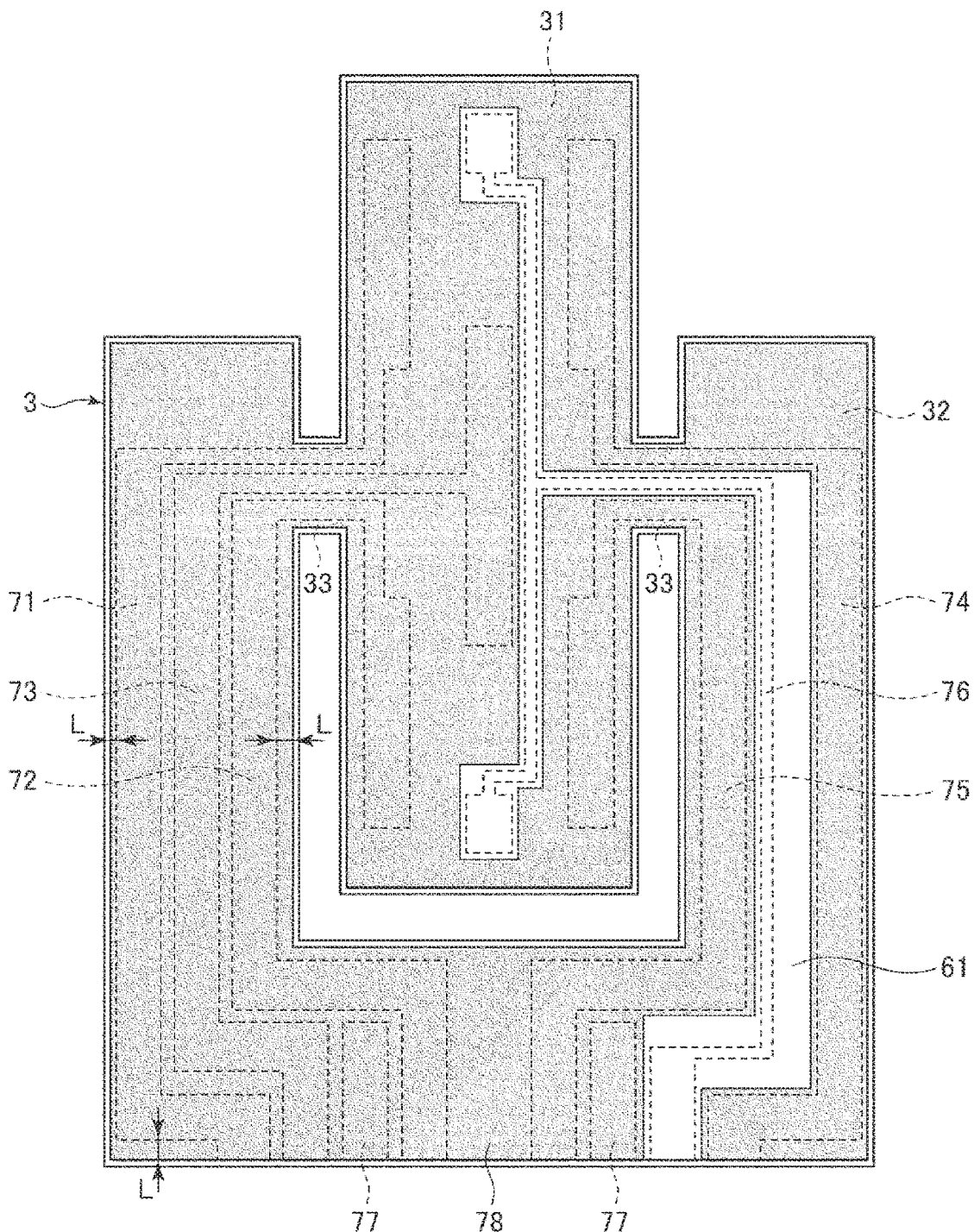
FIG. 13 is a diagram showing a lower layer electrode.
Figure 14:
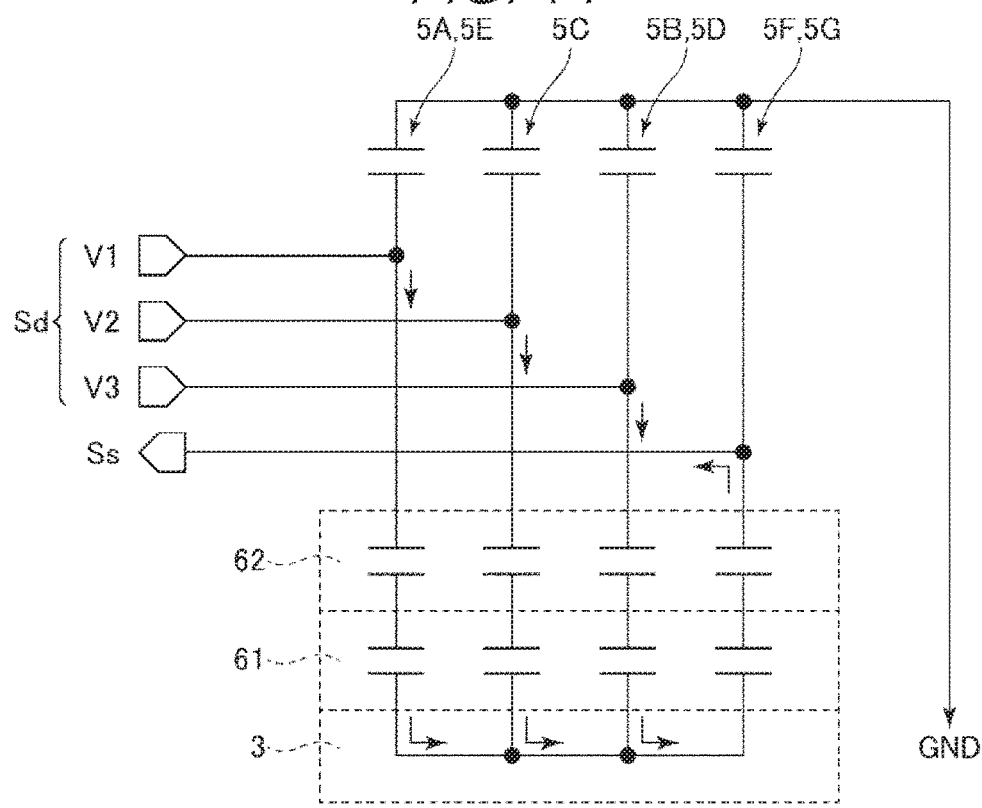
FIG. 14 is a circuit diagram showing an equivalent circuit of an existing piezoelectric driving device.
Figure 15:
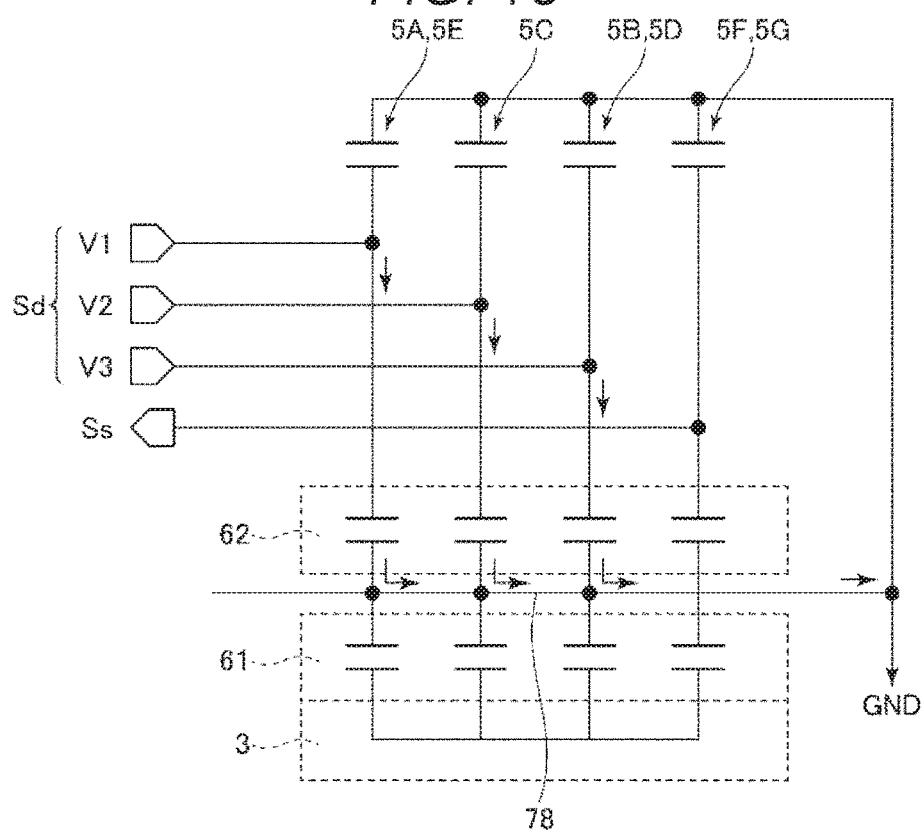
FIG. 15 is a circuit diagram showing an equivalent circuit of the piezoelectric driving device according to the first embodiment.
Figure 16:
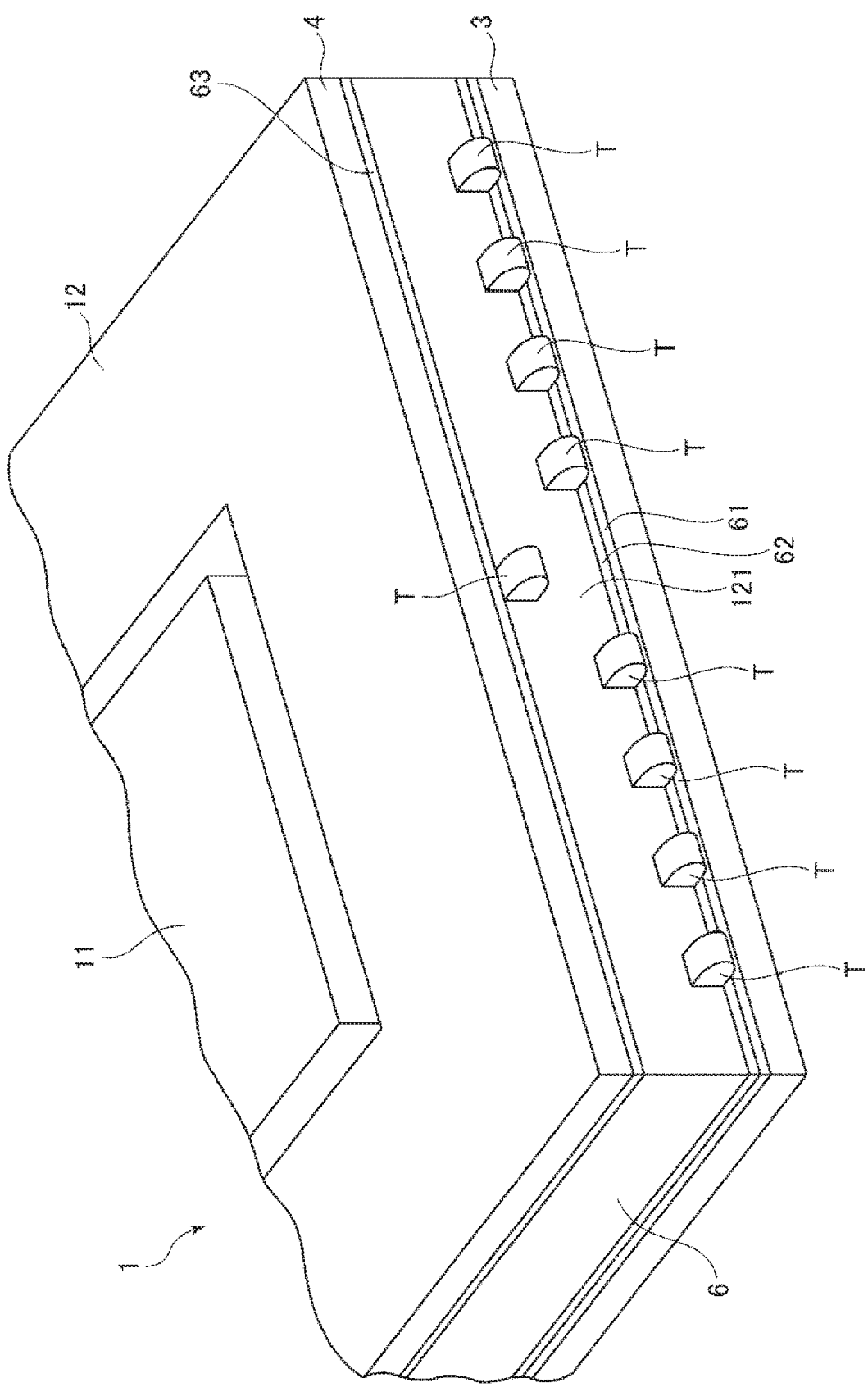
FIG. 16 is a perspective view showing a proximal end side of the piezoelectric driving device.

FIG. 1 is a perspective view showing an overall configuration of the piezoelectric motor according to the first embodiment of the invention. FIG. 2 is an exploded perspective view of a piezoelectric driving device shown in FIG. 1. FIG. 3 is a view of a piezoelectric element included in the piezoelectric driving device shown in FIG. 1 viewed from a second substrate side. FIG. 4 is a view of the piezoelectric element viewed from a first substrate side. FIG. 5 is a diagram showing a voltage applied to the piezoelectric driving device. FIG. 6 is a diagram showing driving of the piezoelectric motor at the time when the voltage shown in FIG. 5 is applied. FIG. 7 is a diagram showing a voltage applied to the piezoelectric driving device. FIG. 8 is a diagram showing driving of the piezoelectric motor at the time when the voltage shown in FIG. 7 is applied. FIG. 9 is an A-A line sectional view in FIG. 1. FIG. 10 is a diagram showing a GND wire. FIG. 11 is a diagram showing a wire for driving and a wire for detection. FIG. 12 is a schematic sectional view showing a wiring structure. FIG. 13 is a diagram showing a lower layer electrode. FIG. 14 is a circuit diagram showing an equivalent circuit of an existing piezoelectric driving device. FIG. 15 is a circuit diagram showing an equivalent circuit of the piezoelectric driving device according to the first embodiment. FIG. 16 is a perspective view showing a proximal end side of the piezoelectric driving device. Note that, in the following explanation, for convenience of explanation, a rotor 110 side of a piezoelectric driving device 1 is referred to as "distal end side" as well and the opposite side of the rotor 110 is referred to as "proximal end side" as well.

A piezoelectric motor 100 (an ultrasonic motor) shown in FIG. 1 includes a rotor 110 functioning as a driven section (a following section) rotatable around a turning axis O and a piezoelectric driving device 1 (a piezoelectric actuator) that is in contact with an outer circumferential surface 111 of the rotor 110. In such a piezoelectric motor 100, the rotor 110 can be rotated around the turning axis O by flexurally vibrating the piezoelectric driving device 1.

Note that the configuration of the piezoelectric motor 100 is not limited to the configuration shown in FIG. 1. For example, a plurality of piezoelectric driving devices 1 may be disposed along the circumferential direction of the rotor 110. The rotor 110 may be rotated by driving of the plurality of piezoelectric driving devices 1. With such a configuration, the piezoelectric motor 100 is capable of rotating the rotor 110 with a larger driving force (torque) and at higher rotating speed. In the piezoelectric driving device 1, a transmitting section 14 may be in contact with principal planes (a pair of opposed flat surfaces) of the rotor 110. The driven section is not limited to a rotating body such as the rotor 110 and may be, for example, a linearly moving mobile body.

As shown in FIG. 1, the piezoelectric driving device includes a vibrating body 11, a supporting section 12 configured to support the vibrating body 11, a connecting section 13 configured to connect to the vibrating body 11 and the supporting section 12, and the transmitting section 14 provided in the vibrating body 11 and configured to transmit vibration of the vibrating body 11 to the rotor 110.

The vibrating body 11 is formed in a rectangular shape (a longitudinal shape) in a plan view from the thickness direction of the piezoelectric driving device 1. The vibrating body 11 flexurally vibrates in an S shape as explained below. The supporting section 12 functions as a fixing section configured to support the vibrating body 11 and fix the piezoelectric driving device 1 to a stage or the like. The supporting section 12 is formed in a U shape surrounding the proximal end side of the vibrating body 11 in the plan view from the thickness direction of the piezoelectric driving device 1. The connecting section 13 connects a portion (the center in the longitudinal direction) functioning as a node of the flexural vibration of the vibrating body 11 and the supporting section 12. However, the shapes and the dispositions of the vibrating body 11, the supporting section 12, and the connecting section 13 are not respectively particularly limited as long as the vibrating body 11, the supporting section 12, and the connecting section 13 can exert the functions thereof.

The transmitting section 14 is provided to project from the center in the width direction on the distal end side of the vibrating body 11. The distal end portion of the transmitting section 14 is in contact with the rotor 110. Therefore, vibration of the vibrating body 11 is transmitted to the rotor 110 via the transmitting section 14. A constituent material of the transmitting section 14 is not particularly limited. However, the constituent material is desirably a rigid material. Examples of such a material include various ceramics such as zirconia, alumina, and titania. Consequently, the transmitting section 14 having high durability is obtained. Deformation of the transmitting section 14 is prevented. The vibration of the vibrating body 11 can be efficiently transmitted to the rotor 110.

The vibrating body 11, the supporting section 12, and the connecting section 13 are formed mainly from a first substrate 3 and a second substrate 4 disposed to be opposed to each other and a piezoelectric element 5 and a spacer 6 located between the first substrate 3 and the second substrate 4.

As shown in FIG. 2, the first substrate 3 includes a vibrating section 31, a supporting section 32 configured to support the vibrating section 31, and connecting sections 33 configured to connect the vibrating section 31 and the supporting section 32. Similarly, the second substrate 4 includes a vibrating section 41, a supporting section 42 configured to support the vibrating section 41, and connecting sections 43 configured to connect the vibrating section 41 and the supporting section 42. The first substrate 3 and the second substrate 4 have the same shape and the same size. The vibrating sections 31 and 41 are disposed to be opposed to each other across the piezoelectric element 5. The supporting sections 32 and 42 are disposed to be opposed to each other across the spacer 6. The vibrating body 11 is configured by a stacked body of the vibrating section 31, the piezoelectric element 5, and the vibrating section 41. The supporting section 12 is configured by a stacked body of the supporting section 32, the spacer 6, and the supporting section 42. The connecting section 13 is configured by the connecting sections 33 and 43.

The first substrate 3 and the second substrate 4 are not particularly limited. For example, a silicon substrate can be used as the first substrate 3 and the second substrate 4. Consequently, the first substrate 3 and the second substrate 4 can be formed at high dimension accuracy by etching or the like.

The piezoelectric element 5 is located between the vibrating sections 31 and 41. The piezoelectric element 5 is bonded to each of the vibrating sections 31 and 41 via a not-shown insulation adhesive. As shown in FIGS. 3 and 4, the piezoelectric element 5 includes five piezoelectric elements 5A, 5B, 5C, 5D, and 5E for driving and two piezoelectric elements 5F and 5G for detection. The piezoelectric element 5C is disposed along the longitudinal direction of the vibrating body 11 in the center in the width direction of the vibrating body 11. The piezoelectric elements 5A and 5B are disposed side by side in the longitudinal direction of the vibrating body 11 on one side in the width direction of the vibrating body 11 with respect to the piezoelectric element 5C. The piezoelectric elements 5D and 5E are disposed side by side in the longitudinal direction of the vibrating body 11 on the other side. The piezoelectric element 5F is disposed on the distal end side of the piezoelectric element 5C. The piezoelectric element 5G is disposed on the proximal end side.

Each of the piezoelectric elements 5A, 5B, 5C, 5D, 5E, 5F, and 5G has a configuration in which a piezoelectric body 51 is sandwiched by a pair of electrodes 52 and 53. Each of the piezoelectric elements 5A, 5B, 5C, 5D, and 5E for driving applies a voltage between the electrodes 52 and 53 to extend and contract in a direction along the longitudinal direction of the vibrating body 11. On the other hand, each of the piezoelectric elements 5F and 5G for detection generates electric charges through deformation.

Note that, in this embodiment, the piezoelectric body 51 is common to seven piezoelectric elements 5A, 5B, 5C, 5D, 5E, 5F, and 5G. The electrode 52 is also common to the seven piezoelectric elements 5A, 5B, 5C, 5D, 5E, 5F, and 5G and is connected to, for example, the GND. On the other hand, the electrodes 53 are individually formed (formed as separate bodies) in the seven piezoelectric elements 5A, 5B, 5C, 5D, 5E, 5F, and 5G. However, the configuration of the piezoelectric element 5 is not limited to this. For example, both or one of the piezoelectric bodies 51 and the electrodes 52 may be formed individually (formed as separate bodies) in the piezoelectric elements 5A, 5B, 5C, 5D, 5E, 5F, and 5G. For example, the piezoelectric element 5C may be omitted. One of the piezoelectric elements 5F and 5G for detection may be omitted. Disposition of the piezoelectric elements 5A, 5B, 5C, 5D, 5E, 5F, and 5G is not particularly limited.

As a constituent material of the piezoelectric body 51, for example, the piezoelectric ceramics such as lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, and lead scandium niobate can be used. The piezoelectric body 51 made of the piezoelectric ceramics may be formed from, for example, a bulk material. The piezoelectric body 51 may be formed using a sol-gel method or a sputtering method. However, the piezoelectric body 51 is desirably formed from the bulk material. Consequently, it is easy to manufacture the piezoelectric element 5. Note that, as the constituent material of the piezoelectric body 51, polyvinylidene fluoride, quartz, and the like may be used besides the piezoelectric ceramics described above.

The spacer 6 is located between the supporting sections 32 and 42 and bonded to each of the supporting sections 32 and 42 via a not-shown insulation adhesive. The thickness of the spacer 6 is substantially the same as the thickness of the piezoelectric element 5. Deflection of the first substrate 3 and the second substrate 4 is prevented.

The spacer 6 is not particularly limited. For example, various ceramics such as zirconia, alumina, and titania, various metal materials, silicon, and various resin materials can be used. Among these materials, the various ceramics, the various metal materials, and the silicon are desirably used. Consequently, the rigid spacer 6 is obtained. However, when a metal material is used, to give insulation to the spacer 6, it is necessary to perform processing for, for example, applying insulation treatment to the surface of the spacer 6.

For example, a voltage V1 shown in FIG. 5 is applied to the piezoelectric elements 5A and 5E, a voltage V2 shown in FIG. 5 is applied to the piezoelectric element 5C, and a voltage V3 shown in FIG. 5 is applied to the piezoelectric elements 5B and 5D. Consequently, as shown in FIG. 6, the vibrating body 11 flexurally vibrates in an S shape. According to the flexural vibration in the S shape, the transmitting section 14 performs an elliptic motion counterclockwise in FIG. 6. The rotor 110 is pushed ahead by the elliptic motion of the transmitting section 14. The rotor 110 rotates clockwise. Conversely, a voltage V1' shown in FIG. 7 is applied to the piezoelectric elements 5A and 5E, a voltage V2' shown in FIG. 7 is applied to the piezoelectric element 5C, and a voltage V3' shown in FIG. 7 is applied to the piezoelectric elements 5B and 5D. Consequently, as shown in FIG. 8, the vibrating body 11 flexurally vibrates in an S shape. According to the flexural vibration in the S shape, the transmitting section 14 performs an elliptic motion clockwise in FIG. 8. The rotor 110 is pushed ahead by the elliptic motion of the transmitting section 14. The rotor 110 rotates counterclockwise. However, a voltage pattern applied to the piezoelectric driving device 1 is not particularly limited if the transmitting section 14 can be caused to perform the elliptic motion clockwise or counterclockwise. Note that, in the following explanation, for convenience of explanation, the voltages V1, V2, and V3 (the voltages V1', V2', and V3') are collectively referred to as "driving signal Sd" as well.

When the vibrating body 11 vibrates as explained above, the piezoelectric elements 5F and 5G bend. Electric charges generated from the piezoelectric body 51 by the bending are output as a detection signal Ss from the piezoelectric elements 5F and 5G (between the electrodes 52 and 53) (see FIGS. 5 and 7). Driving of the piezoelectric driving device 1 is controlled (feedback-controlled) on the basis of the detection signal Ss. A control method is not particularly limited. However, for example, there is a method of changing the frequency of the driving signal Sd at any time to trace a maximum value of the amplitude of the detection signal Ss. The amplitude of the detection signal Ss is proportional to the amplitude of the vibrating body 11. Therefore, the rotor 110 can be rotated at higher speed by setting the amplitude of the detection signal Ss to the maximum value. As another control method, for example, there is a method of changing the frequency of the driving signal Sd at any time such that a phase difference between the driving signal Sd and the detection signal Ss traces a predetermined value. There is a correlation between the amplitude of the vibrating body 11 and the phase difference. Therefore, the rotor 110 can be rotated at high speed by adjusting the phase difference to a value with which the amplitude of the vibrating body 11 has the maximum value.

Note that such control can be performed by a not-shown control device electrically connected to the piezoelectric driving device 1. The control device is configured by, for example, a computer and includes a processor (CPU), a memory, and an I/F (interface). The processor executes a predetermined computer program (code string) stored in the memory, whereby the control device can perform the control explained above.

As shown in FIG. 9, an insulating film 63 is disposed on the inner surface (a principal plane on the first substrate 3 side) of the second substrate 4. The insulating film 63 is made of silicon oxide ($SiO_2$) and is formed by thermally oxidizing the surface of the second substrate 4, which is the silicon substrate. However, a film forming method for the insulating film 63 is not limited to this. For example, the insulating film 63 may be formed by a CVD method or the like in which TEOS (tetraethoxysilane) is used. A constituent material of the insulating film 63 is not limited to the silicon oxide ($SiO_2$) if the constituent material has insulation. Various resin materials such as epoxy resin, urethane resin, urea resin, melamine resin, phenolic resin, ester resin, and acrylic resin can also be used.

As shown in FIG. 10, a GND wire 79 is disposed on the insulating film 63. The GND wire 79 is disposed to overlap the electrode 52 of the piezoelectric element 5 on the vibrating section 31 and electrically connected to the electrode 52. The GND wire 79 is drawn out from the vibrating section 31 to the supporting section 32 via both the connecting sections 33. In the piezoelectric driving device 1, the piezoelectric element 5 is connected to the GND via the GND wire 79.

A constituent material of the GND wire 79 is not particularly limited if the constituent material has electric conductivity. Examples of the constituent material include metal materials such as aluminum (Al), nickel (Ni), gold (Au), platinum (Pt), iridium (Ir), copper (Cu), titanium (Ti), and tungsten (W), alloys including at least one kind of these metal materials (e.g., a titanium (Ti)/tungsten (W)-based alloy and a copper (Cu)/aluminum (Al)-based alloy), and intermetallic compounds. Among these materials, one kind can be used or two or more kinds can be used in combination (e.g., as a stacked body of two or more layers). The GND wire 79 can be formed by, for example, forming an electrode layer on the insulating film 63 using a film forming method such as vapor deposition or sputtering and patterning the electrode layer with wet etching.

As shown in FIG. 9, an insulating film 61 is disposed on the inner surface (a principal plane on the second substrate 4 side) of the first substrate 3. The insulating film 61 is made of silicon oxide (SiO$_2$) and is formed by thermally oxidizing the surface of the first substrate 3, which is the silicon substrate. However, a film forming method for the insulating film 61 is not limited to this. For example, the insulating film 61 may be formed by a CVD method or the like in which TEOS (tetraethoxysilane) is used. A constituent material of the insulating film 61 is not limited to the silicon oxide (SiO$_2$) if the constituent material has insulation. Various resin materials such as epoxy resin, urethane resin, urea resin, melamine resin, phenolic resin, ester resin, and acrylic resin can also be used.

An insulating film 62 is disposed on the insulating film 61. A constituent material of the insulating film 62 is not particularly limited. Various resin materials such as epoxy resin, urethane resin, urea resin, melamine resin, phenolic resin, ester resin, and acrylic resin can be used. Consequently, the insulating film 62 having sufficient insulation and relatively easily formed is obtained. Note that, as the constituent material of the insulating film 62, silicon oxide (SiO$_2$), silicon nitride (SiN), and the like can be used besides the resin materials described above. For example, when the silicon oxide is used, the insulating film 62 can be formed by a CVD method or the like in which TEOS (tetraethoxysilane) is used. Affinity with the insulating film 61 can be improved by using the silicon oxide (SiO$_2$) as the insulting film 62 in this way.

As shown in FIG. 11, wires for driving 71, 72 73, 74, and 75, a wire for detection 76, and wires for draw-out 77 are disposed on the insulating film 62. The wire for driving 71 is disposed to overlap the electrode 53 of the piezoelectric element 5A on the vibrating section 31 and electrically connected to the electrode 53. The wire for driving 72 is disposed to overlap the electrode 53 of the piezoelectric element 5B on the vibrating section 31 and electrically connected to the electrode 53. The wire for driving 73 is disposed to overlap the electrode 53 of the piezoelectric element 5C on the vibrating section 31 and electrically connected to the electrode 53. The wire for driving 74 is disposed to overlap the electrode 53 of the piezoelectric element 5D on the vibrating section 31 and electrically connected to the electrode 53. The wire for driving 75 is disposed to overlap the electrode 53 of the piezoelectric element 5E on the vibrating section 31 and electrically connected to the electrode 53. The wire for detection 76 is disposed to overlap the electrodes 53 of the piezoelectric elements 5F and 5G on the vibrating section 31 and electrically connected to the electrode 53.

In the piezoelectric driving device 1, the driving signal Sd is applied to the piezoelectric elements 5A, 5B, 5C, 5D, and 5E via the wires for driving 71, 72, 73, 74, and 75. The detection signal Ss is acquired from the piezoelectric elements 5F and 5G via the wire for detection 76.

The wires for driving 71, 72, and 73 are respectively drawn out from the vibrating section 31 to the supporting section 32 via one connecting section 33 (on the left side in FIG. 11). The wires for driving 74 and 75 and the wire for detection 76 are respectively drawn out from the other connecting section 33 (on the right side in FIG. 11) to the supporting section 32. The wires for draw-out 77 are provided in only the supporting section 32 and electrically connected to a lower layer wire 78 explained below via a not-shown via (through-electrode). The wires for draw-out 77 are wires for drawing out the lower layer wire 78 onto the insulating film 62.

A constituent material of the wires 71, 72, 73, 74, 75, 76, and 77 is not particularly limited if the constituent material has electric conductivity. Examples of the constituent material include metal materials such as aluminum (Al), nickel (Ni), gold (Au), platinum (Pt), iridium (Ir), copper (Cu), titanium (Ti), and tungsten (W), alloys including at least one kind of these metal materials (e.g., a titanium (Ti)/tungsten (W)-based alloy and a copper (Cu)/aluminum (Al)-based alloy), and intermetallic compounds. Among these materials, one kind can be used or two or more kinds can be used in combination (e.g., as a stacked body of two or more layers). The wires 71, 72, 73, 74, 75, 76, and 77 can be formed by, for example, forming an electrode layer on the insulating film 62 using a film forming method such as vapor deposition or sputtering and patterning the electrode layer with wet etching.

Note that, as shown in FIG. 12, in this embodiment, the wires 71, 72, 73, 74, 75, 76, and 77 are respectively configured by a stacked body of a first layer 7a made of TiW, a second layer 7b made of Cu, and a third layer 7c made of TiW. The thickness of the first layer 7a is approximately 50 nm. The thickness of the second layer 7b is approximately 1000 nm. The thickness of the third layer 7c is approximately 20 nm.

On the supporting section 32, the wire for detection 76 is formed at width narrower than the wires for driving 71, 72, 73, 74, and 75. Specifically, on the supporting section 32, when the minimum width of the wire for detection 76 is represented as W1 and the minimum width of the wires for driving 71, 72, 73, 74, and 75 is represented as W2, a relation of W1<W2 is satisfied. From another viewpoint, on the supporting section 32, when the average width of the wire 76 is represented as W1' and the average width of the wires 71, 72, 73, 74, and 75 is represented as W2', a relation of W1'<W2' is satisfied. Consequently, the wire for detection 76 is sufficiently thin. Parasitic capacitance coupled to the wire for detection 76 can be reduced. Therefore, the detection signal Ss can be more accurately acquired via the wire for detection 76. For example, the parasitic capacitance coupled to the wire for detection 76 is desirably 1/10 or less and more desirably 1/20 or less with respect to piezoelectric capacitance for detection connected to the wire for detection 76. On the other hand, the wires for driving 71, 72, 73, 74, and 75 are sufficiently thick. The resistance of the wires for driving 71, 72, 73, 74, and 75 can be set sufficiently low (e.g., 5Ω or less). The driving signal Sd can be efficiently applied to the piezoelectric element 5 via the wires for driving 71, 72, 73, 74, and 75.

Note that the minimum width W1 of the wire for detection 76 is not particularly limited. However, for example, the minimum width W1 is desirably 10 μm or more and 30 μm or less and more desirably 15 μm or more and 25 μm or less. Consequently, it is possible to obtain the sufficiently thin wire for detection 76 while preventing mechanical damage such as disconnection. On the other hand, the minimum width W2 of the wires for driving 71, 72, 73, 74, and 75 is not particularly limited. However, for example, the minimum width W2 is desirably 50 μm or more and 500 μm or less and more desirably 100 μm or more and 200 μm or less. Consequently, it is possible to sufficiently reduce resistance values of the wires for driving 71, 72, 73, 74, and 75 while preventing an excessive increase in the width of the wires for driving 71, 72, 73, 74, and 75.

As shown in FIG. 9, the piezoelectric driving device includes the lower layer wire 78 provided between the insulating film 61 and the insulating film 62. As shown in FIG. 13, the lower layer wire 78 is disposed to overlap the wires for driving 71, 72, 73, 74, and 75 in a plan view of the first substrate 3. The lower layer wire 78 is set to fixed potential (constant potential). In particular, in this embodiment, the lower layer wire 78 is connected to a ground GND (0 V). However, the potential of the lower layer wire 78 is not limited to the GND if the lower layer wire 78 is set to the fixed potential. The fixed potential includes slightly fluctuating potential (e.g., potential having technically unavoidable fluctuation) besides the constant potential.

Because the piezoelectric driving device 1 includes such a lower layer wire 78, the piezoelectric driving device 1 can exert characteristics explained below. For example, when the lower layer wire 78 is omitted, as in an equivalent circuit shown in FIG. 14, the wires for driving 71, 72, 73, 74, and 75 and the wire for detection 76 are capacitively coupled via the first substrate 3 (the silicon substrate). The driving signal Sd applied to the wires for driving 71, 72, 73, 74, and 75 is mixed in the wire for detection 76 via the first substrate 3. Therefore, noise due to the driving signal Sd occurs in the detection signal Ss, an S/N ratio decreases, and a vibration state of the vibrating body 11 cannot be accurately detected. Therefore, accuracy of the feedback control explained above is deteriorated. In particular, because the detection signal Ss is a very small signal compared with the driving signal Sd, when the noise explained above is mixed, detection accuracy is greatly affected by the noise.

On the other hand, when the lower layer wire 78 is disposed as in this embodiment, as in an equivalent circuit shown in FIG. 15, the driving signal Sd applied to the wires for driving 71, 72, 73, 74, and 75 falls to the GND via the lower layer wire 78 before being mixed in the wire for detection 76 via the first substrate 3. Therefore, the driving signal Sd is less easily mixed in the wire for detection 76 via the first substrate 3. Therefore, compared with the configuration in which the lower layer wire 78 is omitted, the S/N ratio of the detection signal Ss is high. The vibration state of the vibrating body 11 can be accurately detected. Therefore, the accuracy of the feedback control explained above is improved.

For example, by using a high-resistance silicon substrate (a silicon substrate having high purity) as the first substrate 3, the capacitance coupling of the wires for driving 71, 72, 73, 74, and 75 and the wire for detection 76 via the first substrate 3 can also be prevented. However, the high-resistance silicon substrate is extremely expensive. If the high-resistance silicon substrate is adopted as the first substrate 3, manufacturing cost of the piezoelectric driving device 1 markedly increases. Because the high-resistance silicon substrate is fragile, it is difficult to secure mechanical strength enough for withstanding the flexural vibration of the vibrating body 11 explained above. From such a viewpoint, it is extremely difficult to use the high-resistance silicon substrate as the first substrate 3. On the other hand, if a silicon substrate not having a resistance value as high as the resistance value of the high-resistance silicon substrate because impurities are mixed therein (hereinafter simply referred to as "silicon substrate") is used, the capacitance coupling of the wires for driving 71, 72, 73, 74, and 75 and the wire for detection 76 via the first substrate 3 occurs. However, the silicon substrate is inexpensive compared with the high-resistance silicon substrate. The mechanical strength enough for withstanding the flexural vibration of the vibrating body 11 can be easily secured. Therefore, it is extremely effective from the viewpoints of the manufacturing cost and the mechanical strength of the piezoelectric driving device 1 to solve the problems explained above by using the silicon substrate as the first substrate 3 and disposing the lower layer wire 78.

As shown in FIG. 13, the lower layer wire 78 is disposed to overlap substantially the entire region of the wires for driving 71, 72, 73, 74, and 75 in the plan view of the first substrate 3. Consequently, the effects explained above are conspicuous. However, the lower layer wire 78 is not limited to this and only has to be disposed to overlap at least a part of the wires for driving 71, 72, 73, 74, and 75 in the plan view of the first substrate 3. More specifically, the lower layer wire 78 desirably overlaps 80% or more, more desirably overlaps 90% or more, and still more desirably overlaps 95% or more of the wires for driving 71, 72, 73, 74, and 75 in the plan view of the first substrate 3.

A constituent material of the lower layer wire 78 is not particularly limited if the constituent material has electric conductivity. For example, the same materials as the materials enumerated as the examples of the wires 71, 72, 73, 74, 75, 76, and 77 above can be used. The lower layer wire 78 can be formed by forming an electrode layer on the insulating film 61 using a film forming method such as vapor deposition or sputtering and patterning the electrode layer with wet etching. Note that, in this embodiment, the lower layer wire 78 is formed by one layer of TiW. The thickness of the lower layer wire 78 is approximately 100 nm. Consequently, the lower layer wire 78 having sufficiently low resistance (e.g., 200Ω or less) is obtained.

As shown in FIG. 13, the lower layer wire 78 is disposed not to overlap the wire for detection 76 in the plan view of the first substrate 3. Consequently, the wire for detection 76 and the lower layer wire 78 are less easily capacitively coupled. Therefore, a part of the detection signal Ss can be prevented from falling to the GND via the lower layer wire 78. Consequently, attenuation of the detection signal Ss is reduced. The detection signal Ss having higher intensity is obtained. Therefore, it is possible to more accurately detect the vibration state of the vibrating body 11.

Capacitance formed between the wires for driving 71, 72, 73, 74, and 75 and the lower layer wire 78 is desirably smaller. Specifically, for example, the capacitance is 30% or less, more desirably 10% or less, and still more desirably 5% or less of the capacitance of the piezoelectric elements 5A, 5B, 5C, 5D, and 5E (the capacitance formed between the electrodes 52 and 53). Consequently, electric power falling to the lower layer wire 78 can be reduced. The driving signal Sd can be efficiently applied to the piezoelectric elements 5A, 5B, 5C, 5D, and 5E. Therefore, power saving of the piezoelectric driving device 1 can be achieved.

As shown in FIG. 13, the lower layer wire 78 is formed to project to the outer side from the contours of the wires for driving 71, 72, 73, 74, and 75 in the plan view of the first substrate 3. Consequently, positional deviation (mask deviation during wet etching) between the lower layer wire 78 and the wires for driving 71, 72, 73, 74, and 75 can be allowed. The lower layer wire 78 can be more surely disposed to overlap the wires for driving 71, 72, 73, 74, and 75. Note that a projecting amount L of the lower layer wire 78 from the contours of the wires for driving 71, 72, 73, 74, and 75 is not particularly limited and is different depending on formation accuracy of a mask. However, the projecting amount L is desirably 5 μm or more. In general, the mask deviation could occur by approximately ±2 μm. Therefore, by securing the projecting amount L by 5 μm or more as explained above, the mask deviation can be more surely allowed.

The wires 71, 72, 73, 74, 75, 76, 77, 78, and 79 are explained above. Among the wires, the wires 71, 72, 73, 74, 75, 76, 77, and 79 are electrically connected to terminals T provided on a proximal end face 121 of the supporting section as shown in FIG. 16. Consequently, it is easy to electrically connect the piezoelectric driving device 1 and an external device (e.g., the control device explained above).

The piezoelectric motor 100 and the piezoelectric driving device 1 are explained above. The piezoelectric driving device 1 includes, as explained above, the first substrate 3 (a substrate), the insulating film 62 (a first insulating film) disposed on the inner surface (one surface) side of the first substrate 3, the piezoelectric elements 5A, 5B, 5C, 5D, and 5E (piezoelectric elements for driving) disposed above (a surface side opposite to the first substrate 3) of the insulating film 62 and configured to vibrate the first substrate 3, the piezoelectric elements 5F and 5G (piezoelectric elements for detection) disposed above (on the surface side opposite to the first substrate 3) of the insulating film 62 and configured to detect the vibration of the first substrate 3, the wires for driving 71, 72, 73, 74, and 75 disposed above (on the surface side opposite to the first substrate 3) of the insulating film 62 and electrically connected to the piezoelectric elements 5A, 5B, 5C, 5D, and 5E, the wire for detection 76 disposed above (on the surface side opposite to the first substrate 3) of the insulating film 62 and electrically connected to the piezoelectric elements 5F and 5G, and the lower layer wire 78 disposed between the insulating film 63 and the first substrate 3 and set to the GND (the fixed potential). At least one of the wires for driving 71, 72, 73, 74, and 75 and the wire for detection 76 overlaps the lower layer wire 78 in the plan view of the first substrate 3. Consequently, capacitive coupling of the wires for driving 71, 72, 73, 74, and 75 and the wire for detection 76 via the first substrate 3 can be prevented. Therefore, noise from the driving signal Sd is less easily mixed in the detection signal Ss. A vibration state of the first substrate 3 (the vibrating body 11) can be accurately detected.

As explained above, in the piezoelectric driving device 1, the wires for driving 71, 72, 73, 74, and 75 overlap the lower layer wire 78 in the plan view of the first substrate 3. Consequently, the capacitive coupling of the wires for driving 71, 72, 73, 74, and 75 and the wire for detection 76 via the first substrate 3 can be more surely prevented. In particular, in this embodiment, substantially the entire region of the wires for driving 71, 72, 73, 74, and 75 overlaps the lower layer wire 78 in the plan view of the first substrate 3. Therefore, the effects explained above are more conspicuous.

As explained above, the lower layer wire 78 includes portions projecting to the outer side from the contours of the wires for driving 71, 72, 73, 74, and 75 in the plan view of the first substrate 3. Consequently, for example, the positional deviation between the lower layer wire 78 and the wires for driving 71, 72, 73, 74, and 75 can be allowed. The lower layer wire 78 can be more surely disposed to overlap the wires for driving 71, 72, 73, 74, and 75.

As explained above, the wire for detection 76 does not overlap the lower layer wire 78 in the plan view of the first substrate 3. Consequently, the wire for detection 76 and the lower layer wire 78 are less easily capacitively coupled. Therefore, a part of the detection signal Ss can be prevented from falling to the GND via the lower layer wire 78. Consequently, the attenuation of the detection signal Ss is reduced and the detection signal Ss having higher intensity is obtained. Therefore, the vibration state of the vibrating body 11 can be more accurately detected.

As explained above, the width of the wire for detection 76 is smaller than the width of the wires for driving 71, 72, 73, 74, and 75. Consequently, the wire for detection 76 is sufficiently thin. The parasitic capacitance coupled to the wire for detection 76 can be reduced. Therefore, the detection signals Ss can be more accurately acquired via the wire for detection 76. On the other hand, the wires for driving 71, 72, 73, 74, and 75 are sufficiently thick. The resistance of the wires for driving 71, 72, 73, 74, and 75 can be set sufficiently low. The driving signal Sd can be efficiently applied to the piezoelectric element 5 via the wires for driving 71, 72, 73, 74, and 75.

As explained above, the piezoelectric driving device 1 includes the insulating film 61 (a second insulating film) disposed between the first substrate 3 and the lower layer wire 78. Consequently, the lower layer wire 78 can be more surely insulated from the first substrate 3.

As explained above, the first substrate 3 is the silicon substrate. Consequently, for example, the first substrate 3 can be formed at high dimension accuracy by etching or the like.

As explained above, the lower layer wire 78 is connected to the ground (GND). Consequently, a device configuration is simplified.

As explained above, the first substrate 3 includes the vibrating section 31 and the supporting section 32 configured to support the vibrating section 31. The piezoelectric elements 5A, 5B, 5C, 5D, and 5E and the piezoelectric elements 5F and 5G are respectively disposed in the vibrating section 31. Consequently, the vibrating section 31 can be efficiently vibrated. The vibration state of the vibrating section 31 can be accurately detected.

As explained above, the piezoelectric motor 100 includes the piezoelectric driving device 1 and the rotor 110 (a driven section) that is in contact with the piezoelectric driving device 1. Consequently, the piezoelectric motor 100 can enjoy the effects of the piezoelectric driving device 1 explained above. The piezoelectric motor 100 having high reliability is obtained.

Second Embodiment

A piezoelectric driving device according to a second embodiment of the invention is explained.

Figure 17:
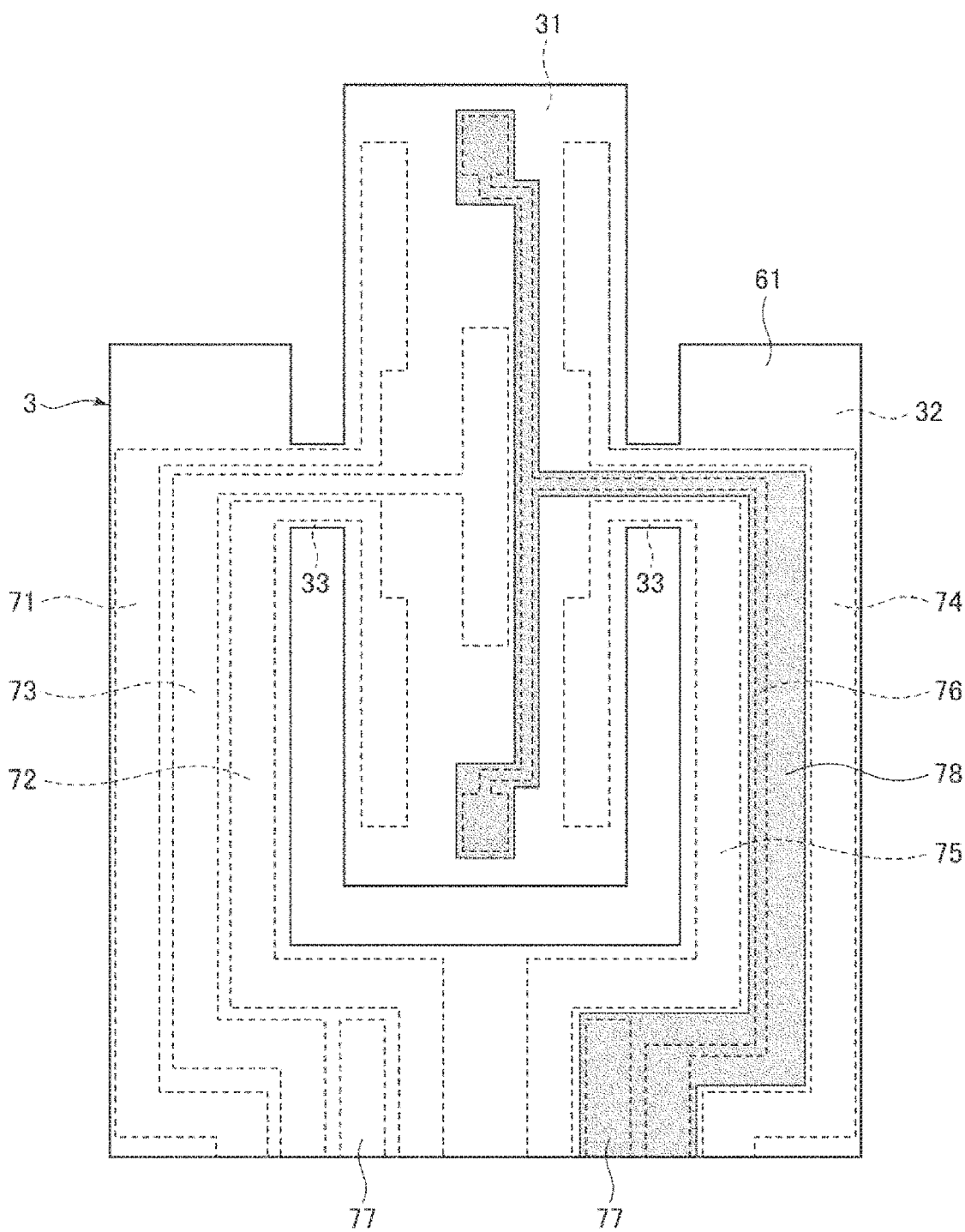
FIG. 17 is a diagram showing a lower layer wire of a piezoelectric driving device according to a second embodiment of the invention.

FIG. 17 is a diagram showing a lower layer wire of the piezoelectric driving device according to the second embodiment of the invention.

The piezoelectric driving device according to this embodiment is the same as the piezoelectric driving device 1 according to the first embodiment mainly except that the configuration of the lower wiring layer 78 is different.

Note that, in the following explanation, concerning the piezoelectric driving device 1 in the second embodiment, differences from the first embodiment explained above are mainly explained. Explanation of similarities is omitted. In FIG. 17, the same components as the components in the first embodiment are denoted by the same reference numerals and signs.

As shown in FIG. 17, in this embodiment, the lower layer wire 78 is disposed to overlap the wire for detection 76 in the plan view of the first substrate 3. The lower layer wire 78 is disposed not to overlap the wires for driving 71, 72, 73, 74, and 75. Even if the lower layer wire 78 is disposed in this way, as in the first embodiment, the capacitive coupling of the wires for driving 71, 72, 73, 74, and 75 and the wire for detection 76 via the first substrate 3 can be prevented.

Note that, in this embodiment, the lower layer wire 78 is disposed to overlap substantially the entire region of the wire for detection 76. However, the lower layer wire 78 is not limited to this and only has to be disposed to overlap at least a part of the wire for detection 76.

Third Embodiment

A piezoelectric driving device according to a third embodiment of the invention is explained.

Figure 18:
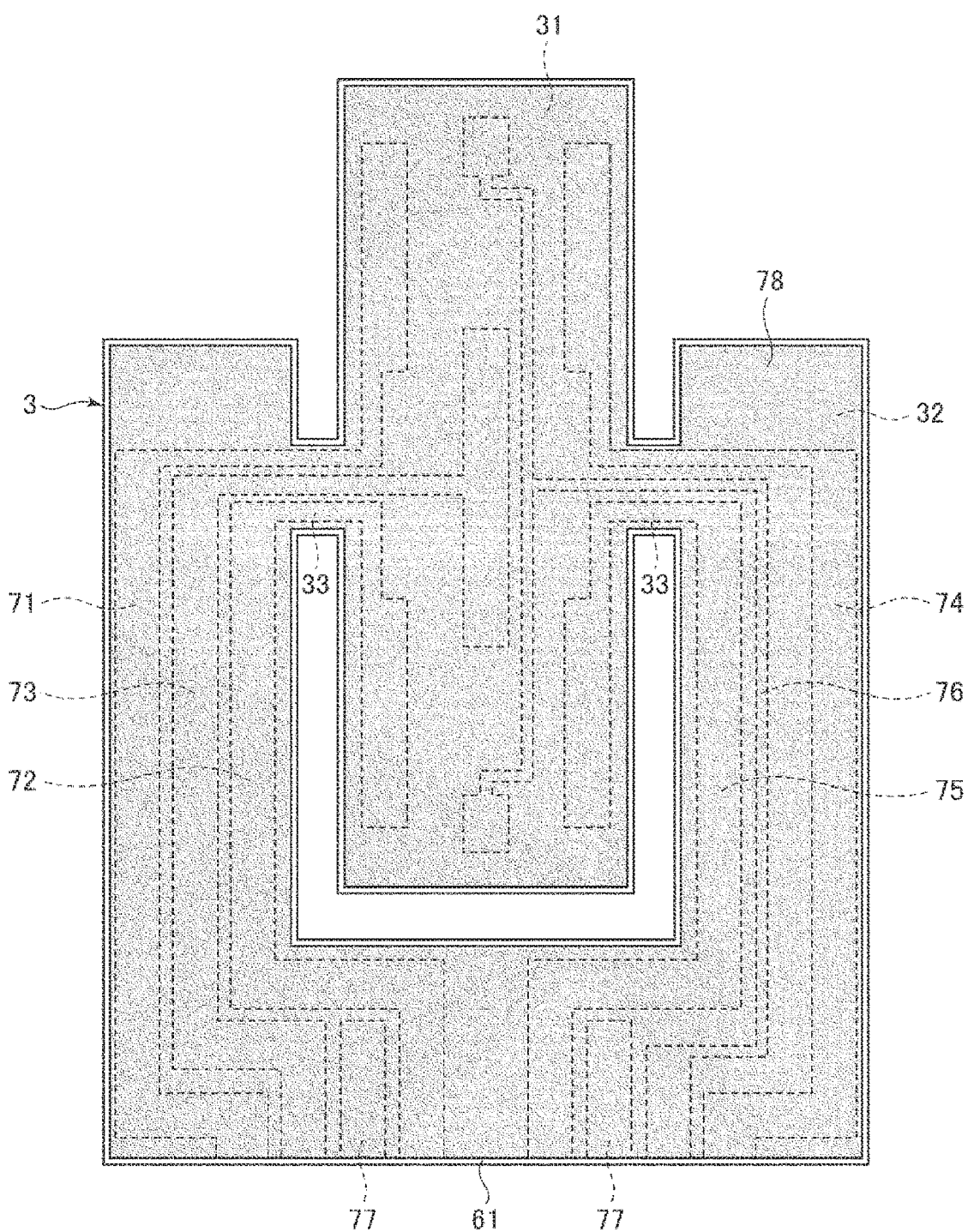
FIG. 18 is a diagram showing a lower layer wire of a piezoelectric driving device according to a third embodiment of the invention.

FIG. 18 is a diagram showing a lower layer wire of the piezoelectric driving device according to the third embodiment of the invention.

The piezoelectric driving device according to this embodiment is the same as the piezoelectric driving device 1 according to the first embodiment mainly except that the configuration of the lower wiring layer 78 is different.

Note that, in the following explanation, concerning the piezoelectric driving device 1 in the third embodiment, differences from the first embodiment explained above are mainly explained. Explanation of similarities is omitted. In FIG. 18, the same components as the components in the first embodiment are denoted by the same reference numerals and signs.

As shown in FIG. 18, in this embodiment, the lower layer wire 78 is disposed to overlap the wires for driving 71, 72, 73, 74, and 75 and the wire for detection 76 in the plan view of the first substrate 3. Even if the lower layer wire 78 is disposed in this way, as in the first embodiment, the capacitive coupling of the wires for driving 71, 72, 73, 74, and 75 and the wire for detection 76 via the first substrate 3 can be prevented.

Note that, in this embodiment, the lower layer wire 78 is disposed to overlap substantially the entire region of the wires for driving 71, 72, 73, 74, and 75 and the wire for detection 76. However, the lower layer wire 78 is not limited to this and only has to be disposed to overlap at least a part of the wires for driving 71, 72, 73, 74, and 75 and the wire for detection 76.

Fourth Embodiment

A robot according to a fourth embodiment of the invention is explained.

Figure 19:
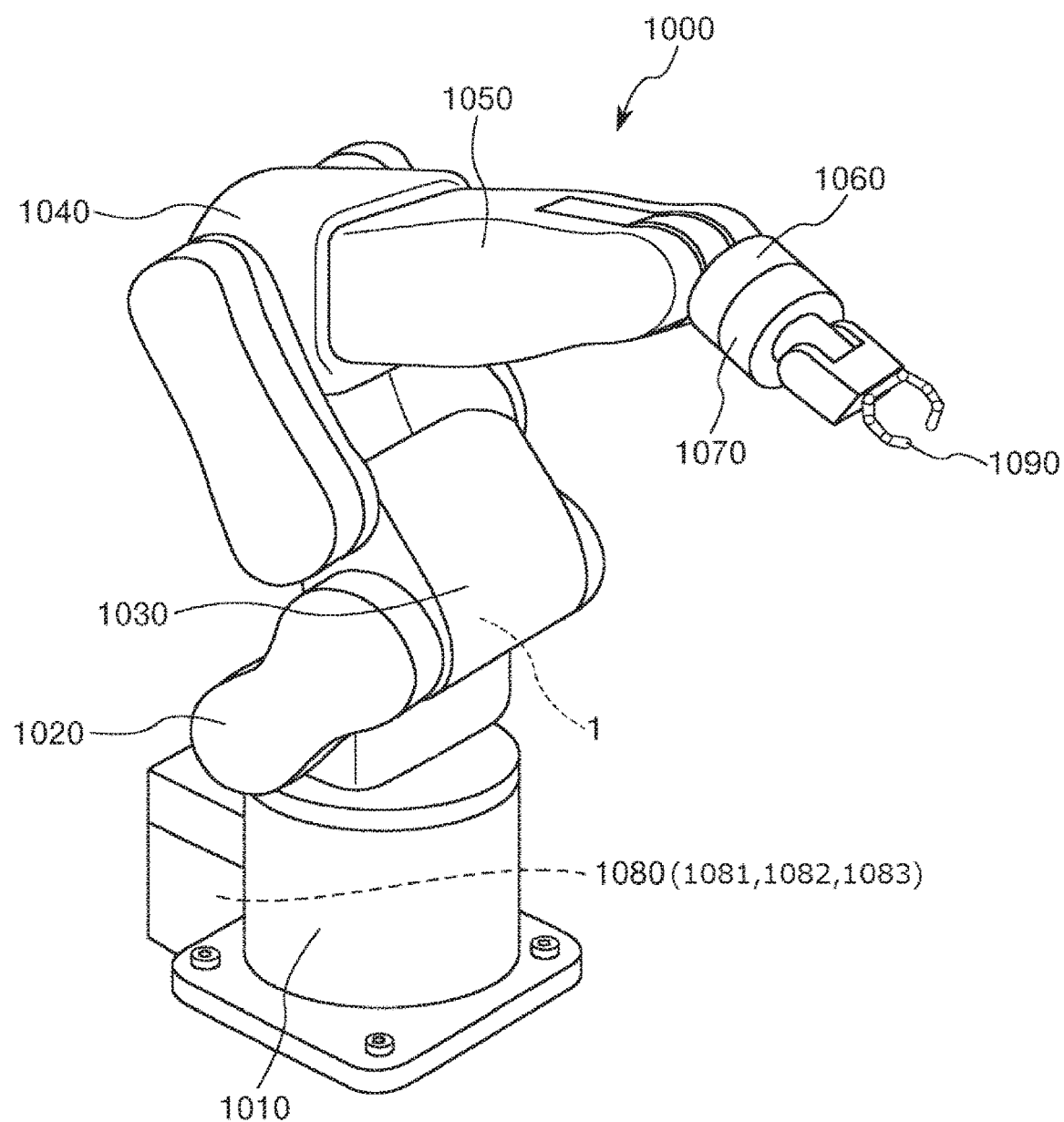
FIG. 19 is a perspective view showing a robot according to a fourth embodiment of the invention.

FIG. 19 is a perspective view showing the robot according to the fourth embodiment of the invention.

A robot 1000 shown in FIG. 19 can perform work such as supply, removal, conveyance, and assembly of a precision device and components configuring the precision device. The robot 1000 is a six-axis robot and includes a base 1010 fixed to a floor and a ceiling, an arm 1020 turnably coupled to the base 1010, an arm 1030 turnably coupled to the arm 1020, an arm 1040 turnably coupled to the arm 1030, an arm 1050 turnably coupled to the arm 1040, an arm 1060 turnably coupled to the arm 1050, an arm 1070 turnably coupled to the arm 1060, and a control device 1080 configured to control driving of the arms 1020, 1030, 1040, 1050, 1060, and 1070.

A hand connecting section is provided in the arm 1070. An end effector 1090 corresponding to work to be executed by the robot 1000 is attached to the hand connecting section. The piezoelectric driving devices 1 are mounted in all or a part of joint sections. The arms 1020, 1030, 1040, 1050, 1060, and 1070 turn according to driving of the piezoelectric driving devices 1. Note that the piezoelectric driving device 1 may be mounted in the end effector 1090 and used for driving of the end effector 1090.

The control device 1080 is configured by a computer and includes, for example, a processor 1081 (a CPU), a memory 1082, and an I/F 1083 (an interface). The processor 1081 executes a predetermined computer program (code string) stored in the memory 1082 to control driving of the sections (in particular, the piezoelectric driving devices 1) of the robot 1000. Note that the computer program may be downloaded from an external server via the I/F 1083. All or a part of the components of the control device 1080 may be provided on the outside of the robot 1000 and connected via a communication network such as a LAN (local area network).

Such a robot 1000 includes the piezoelectric driving devices 1. Therefore, the robot 1000 can enjoy the effects of the piezoelectric driving device 1 explained above and can exert high reliability.

Fifth Embodiment

An electronic-component conveying apparatus according to a fifth embodiment of the invention is explained.

Figure 20:
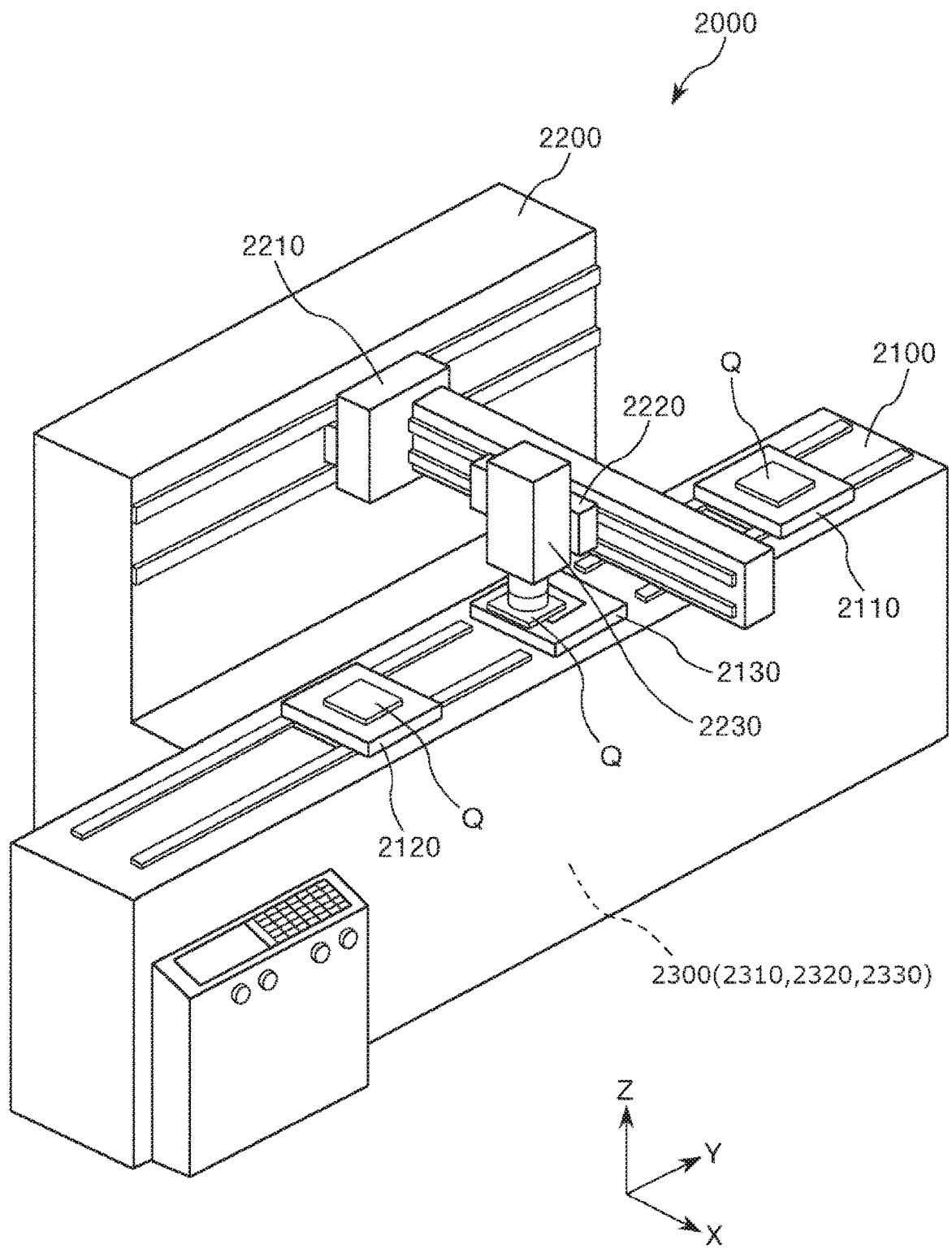
FIG. 20 is a perspective view showing an electronic-component conveying apparatus according to a fifth embodiment of the invention.
Figure 21:
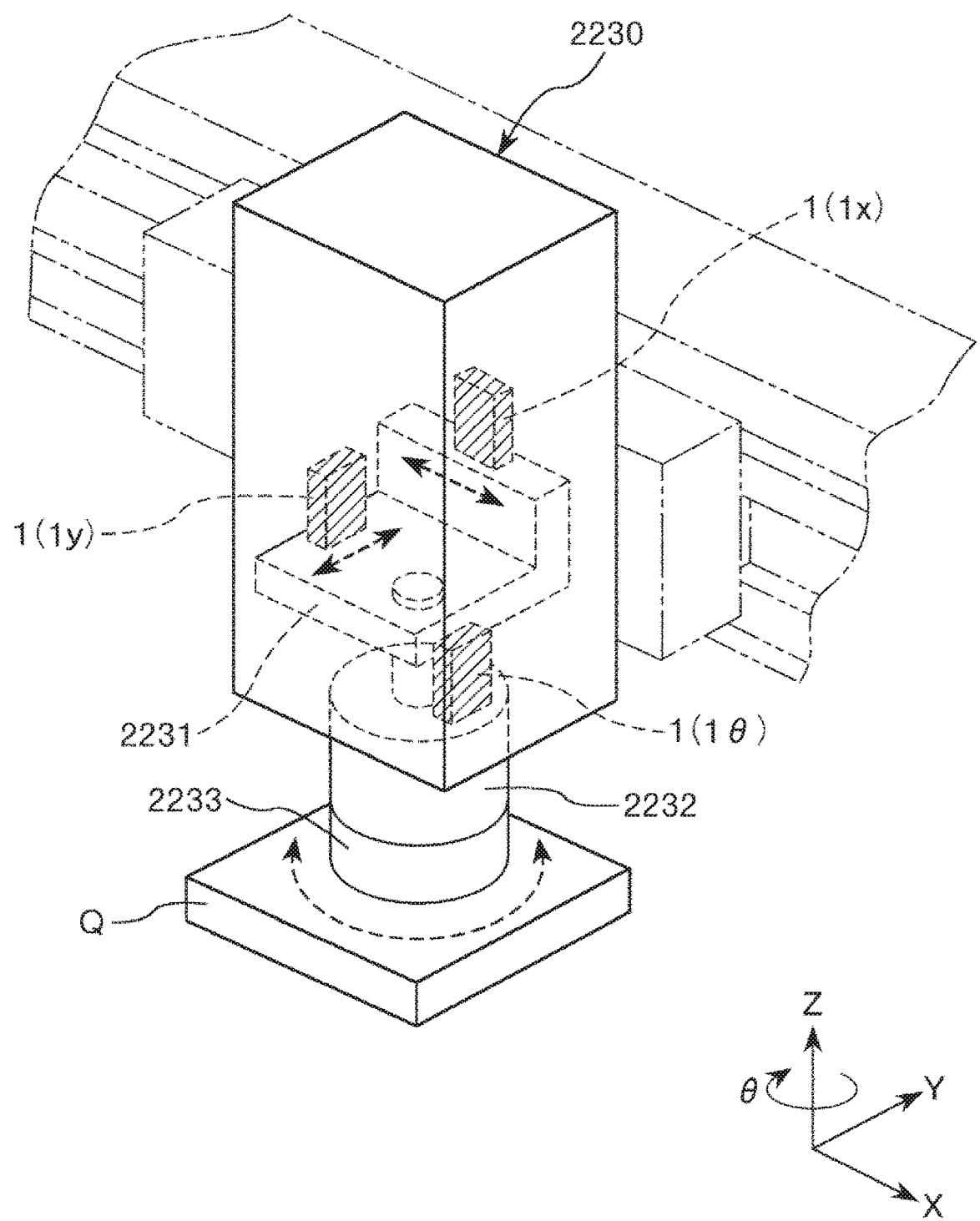
FIG. 21 is a perspective view showing an electronic-component holding section included in the electronic-component conveying apparatus shown in FIG. 20.

FIG. 20 is a perspective view showing the electronic-component conveying apparatus according to the fifth embodiment of the invention. FIG. 21 is a perspective view showing an electronic-component holding section included in the electronic-component conveying apparatus shown in FIG. 20. Note that, in the following explanation, for convenience of explanation, three axes orthogonal to one another are represented as an X axis, a Y axis, and a Z axis.

An electronic-component conveying apparatus 2000 shown in FIG. 20 is applied to an electronic-component inspection apparatus. The electronic-component conveying apparatus 2000 includes a base 2100, a supporting table 2200 disposed on a side of the base 2100, and a control device 2300 configured to control driving of sections. On the base 2100, an upstream side stage 2110 on which an inspection target electronic component Q is placed and conveyed in the Y-axis direction, a downstream side stage 2120 on which an inspected electronic component Q is placed and conveyed in the Y-axis direction, and an inspection table 2130 located between the upstream side stage 2110 and the downstream side stage 2120 and used to inspect electric characteristics of the electronic component Q are provided. Note that examples of the electronic component Q include a semiconductor, a semiconductor wafer, display devices such as a CLD and an OLED, a quartz device, various sensors, an inkjet head, and various MEMS devices.

On the supporting table 2200, a Y stage 2210 movable in the Y-axis direction with respect to the supporting table 2200 is provided. On the Y stage 2210, an X stage 2220 movable in the X-axis direction with respect to the Y stage 2210 is provided. On the X stage 2220, an electronic-component holding section 2230 movable in the Z-axis direction with respect to the X stage 2220 is provided.

As shown in FIG. 21, the electronic-component holding section 2230 includes a fine adjustment plate 2231 movable in the X-axis direction and the Y-axis direction, a turning section 2232 turnable around the Z axis with respect to the fine adjustment plate 2231, and a holding section 2233 configured to hold the electronic component Q. The piezoelectric driving device 1 (1*x*) for moving the fine adjustment plate 2231 in the X-axis direction, the piezoelectric driving device 1 (1*y*) for moving the fine adjustment plate 2231 in the Y-axis direction, and the piezoelectric driving device 1 (1θ) for turning the turning section 2232 around the Z axis are incorporated in the electronic-component holding section 2230.

The control device 2300 is configured by a computer and includes, for example, a processor 2310 (a CPU), a memory 2320, and an I/F 2330 (an interface). The processor 2310 executes a predetermined computer program (code string) stored in the memory 2320 to control driving of the sections (in particular, the piezoelectric driving devices 1) of the electronic-component conveying apparatus 2000. Note that the computer program may be downloaded from an external server via the I/F 2330. All or apart of components of the control device 2300 may be provided on the outside of the electronic-component conveying apparatus 2000 and connected via a communication network such as a LAN (local area network).

Such an electronic-component conveying apparatus 2000 includes the piezoelectric driving device 1. Therefore, the electronic-component conveying apparatus 2000 can enjoy the effects of the piezoelectric driving device 1 explained above and can exert high reliability.

Sixth Embodiment

A printer according to a sixth embodiment of the invention is explained.

Figure 22:
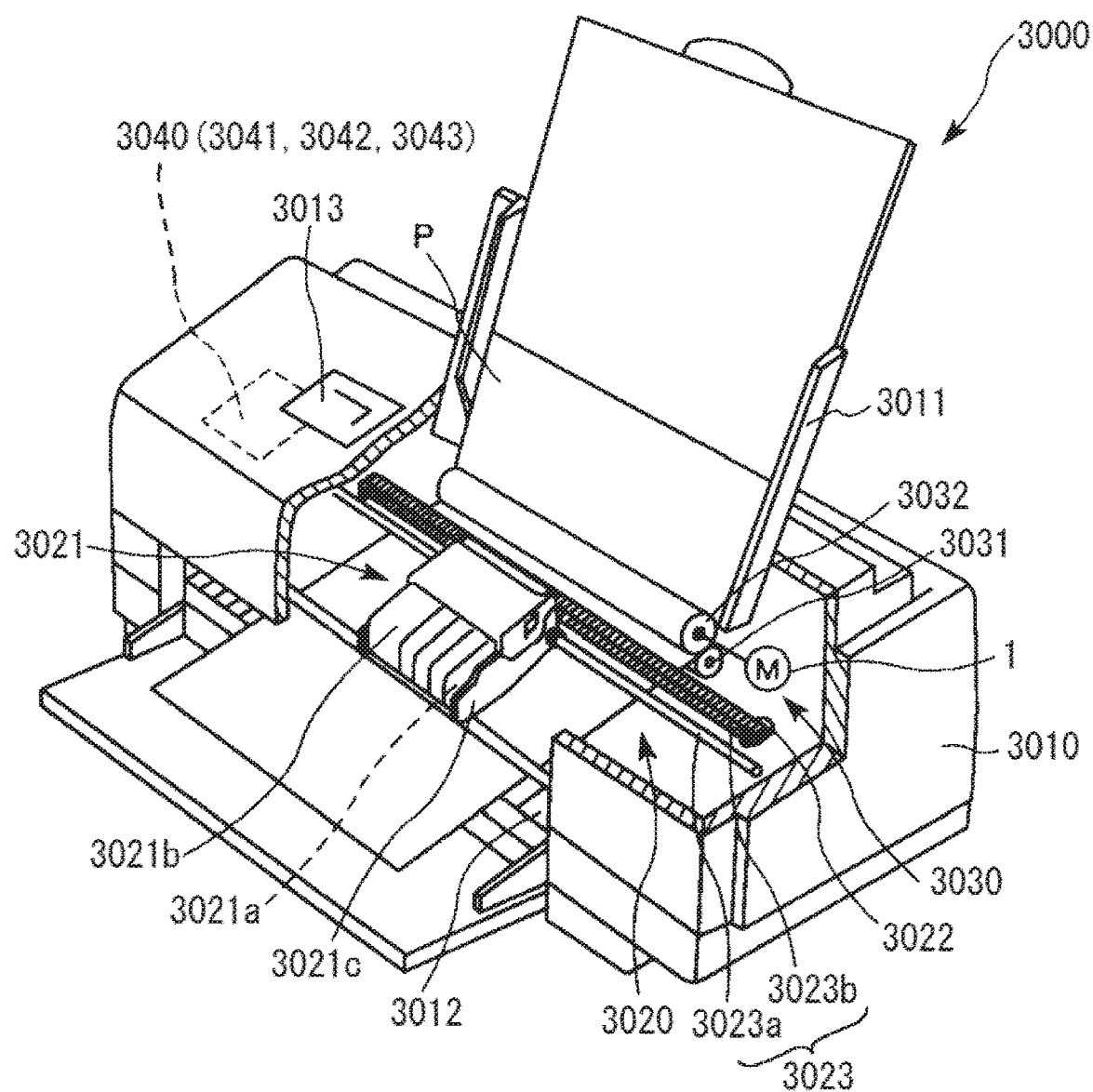
FIG. 22 is a schematic diagram showing an overall configuration of a printer according to a sixth embodiment of the invention.

FIG. 22 is a schematic diagram showing an overall configuration of the printer according to the sixth embodiment of the invention.

A printer 3000 shown in FIG. 22 includes an apparatus body 3010, a printing mechanism 3020 provided on the inside of the apparatus body 3010, a paper feeding mechanism 3030, and a control device 3040. In the apparatus body 3010, a tray 3011 in which recording sheets P are set, a paper discharge port 3012 for discharging the recording sheets P, and an operation panel 3013 such as a liquid crystal display.

The printing mechanism 3020 includes a head unit 3021, a carriage motor 3022, and a reciprocating movement mechanism 3023 configured to reciprocatingly move the head unit 3021 with a driving force of the carriage motor 3022. The head unit 3021 includes a head 3021a, which is an inkjet-type recording head, an ink cartridge 3021b configured to supply ink to the head 3021a, and a carriage 3021c mounted with the head 3021a and the ink cartridge 3021b.

The reciprocating movement mechanism 3023 includes a carriage guide shaft 3023a reciprocatingly movably supporting the carriage 3021c and a timing belt 3023b for moving the carriage 3021c on the carriage guide shaft 3023a with the driving force of the carriage motor 3022. The paper feeding mechanism 3030 includes a driven roller 3031 and a driving roller 3032 that are in press contact with each other and the piezoelectric driving device 1 that drives the driving roller 3032.

In such a printer 3000, the paper feeding mechanism 3030 intermittently feeds the recording sheets P to the vicinity of a lower part of the head unit 3021 one by one. At this time, the head unit 3021 reciprocatingly moves in a direction substantially orthogonal to a feeding direction of the recording sheet P. Printing on the recording sheet P is performed.

The control device 3040 is configured by a computer and includes, for example, a processor 3041 (a CPU), a memory 3042, and an I/F 3043 (an interface). The processor 3041 executes a predetermined computer program (code string) stored in the memory 3042 to control driving of the sections (in particular, the piezoelectric driving device 1) of the printer 3000. Such control is executed, for example, on the basis of printing data input from a host computer such as a personal computer via the I/F 3043. Note that the computer program may be downloaded from an external server via the I/F 3043. All or a part of components of the control device 3040 may be provided on the outside of the printer 3000 and connected via a communication network such as a LAN (local area network).

Such a printer 3000 includes the piezoelectric driving device 1. Therefore, the printer 3000 can enjoy the effects of the piezoelectric driving device 1 explained above and can exert high reliability. Note that, in this embodiment, the piezoelectric driving device 1 drives the driving roller 3032 for feeding. Besides, the piezoelectric driving device 1 may drive, for example, the carriage 3021c.

Seventh Embodiment

A projector according to a seventh embodiment of the invention is explained.

Figure 23:
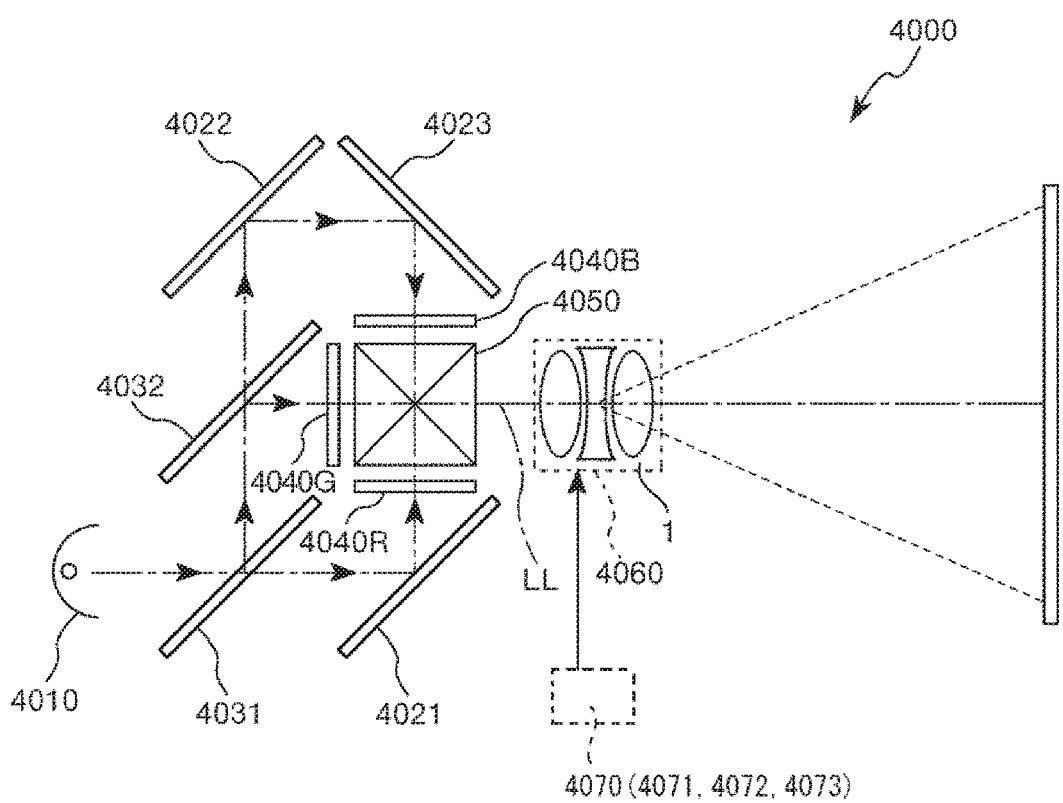
FIG. 23 is a schematic diagram showing an overall configuration of a projector according to a seventh embodiment of the invention.

FIG. 23 is a schematic diagram showing an overall configuration of the projector according to the seventh embodiment of the invention.

A projector 4000 shown in FIG. 23 is a projector of an LCD type. The projector 4000 includes a light source 4010, mirrors 4021, 4022, and 4023, dichroic mirrors 4031 and 4032, liquid crystal display elements 4040R, 4040G, and 4040B, a dichroic prism 4050, a projection lens system 4060, and a control device 4070.

Examples of the light source 4010 include a halogen lamp, a mercury lamp, and a light emitting diode (LED). As the light source 4010, a light source that emits white light is used. First, light emitted from the light source 4010 is separated into red light (R) and the other light by the dichroic mirror 4031. After being reflected on the mirror 4021, the red light is made incident on the liquid crystal display element 4040R. The other light is further separated into green light (G) and blue light (B) by the dichroic mirror 4032. The green light is made incident on the liquid crystal display element 4040G. After being reflected on the mirrors 4022 and 4023, the blue light is made incident on the liquid crystal display element 4040B.

The liquid crystal display elements 4040R, 4040G, and 4040B are respectively used as spatial light modulators. The liquid crystal display elements 4040R, 4040G, and 4040B are respectively spatial light modulators of a transmission type corresponding to the primary colors of R, G, and B. The liquid crystal display elements 4040R, 4040G, and 4040B, include pixels arrayed in a matrix shape of longitudinal 1080 rows and lateral 1920 columns. In the pixels, light amounts of transmitted lights with respect to the incident lights are adjusted. Light amount distributions of all the pixels are cooperatively controlled in the liquid crystal display elements 4040R, 4040G, and 4040B. The lights respectively spatially modulated by such liquid crystal display elements 4040R, 4040G, and 4040B are combined by the dichroic prism 4050. Full-color video light LL is emitted from the dichroic prism 4050. The emitted video light LL is enlarged by the projection lens system 4060 and projected on, for example, a screen. Note that, in the projector 4000, the piezoelectric driving device 1 is used to move at least one lens included in the projection lens system 4060 in the optical axis direction and change a focal length.

The control device 4070 is configured by a computer and includes, for example, a processor 4071 (a CPU), a memory 4072, and an I/F 4073 (an interface). The processor 4071 executes a predetermined computer program (code string) stored in the memory 4072 to control driving of the sections (in particular, the piezoelectric driving device 1) of the projector 4000. Note that the computer program may be downloaded from an external server via the I/F 4073. All or a part of the components of the control device 4070 may be provided on the outside of the projector 4000 and connected via a communication network such as a LAN (local area network).

Such a projector 4000 includes the piezoelectric driving device 1. Therefore, the projector 4000 can enjoy the effects of the piezoelectric driving device 1 explained above and exert high reliability.

The embodiments of a piezoelectric driving device, a piezoelectric motor, a robot, an electronic-component conveying apparatus, a printer and a projector according to the invention are explained above with reference to the drawings. However, the invention is not limited to the embodiments. The components of the sections can be replaced with any components having the same functions. Any other components may be added to the invention. The embodiments may be combined as appropriate.

In the embodiments, the configuration is explained in which the piezoelectric driving device is applied to the piezoelectric motor, the robot, the electronic-component conveying apparatus, the printer, and the projector. The piezoelectric driving device can be applied to various electronic devices besides these apparatuses.

The entire disclosure of Japanese Patent Application No. 2017-182640, filed Sep. 22, 2017 is expressly incorporated by reference herein.

What is claimed is:

1. A piezoelectric driving device comprising:
a substrate;
a first insulating film disposed above one surface of the substrate;
a piezoelectric element for driving disposed above the first insulating film and configured to vibrate the substrate;
a piezoelectric element for detection disposed above the first insulating film and configured to detect the vibration of the substrate;
a wire for driving disposed above the first insulating film and electrically connected to the piezoelectric element for driving;
a wire for detection disposed above the first insulating film and electrically connected to the piezoelectric element for detection; and
a lower layer wire disposed between the first insulating film and the substrate and set to fixed potential, wherein
at least one of the wire for driving and the wire for detection overlaps the lower layer wire in a plan view of the substrate.

2. The piezoelectric driving device according to claim 1, wherein the wire for driving overlaps the lower layer wire in the plan view of the substrate.

3. The piezoelectric driving device according to claim 2, wherein the lower layer wire includes a portion projecting to an outer side from a contour of the wire for driving in the plan view of the substrate.

4. The piezoelectric driving device according to claim 2, wherein the wire for detection overlaps the lower layer wire in the plan view of the substrate.

5. The piezoelectric driving device according to claim 1, wherein width of the wire for detection is smaller than width of the wire for driving.

6. The piezoelectric driving device according to claim 1, further comprising a second insulating film disposed between the substrate and the lower layer wire.

7. The piezoelectric driving device according to claim 1, wherein the substrate is a silicon substrate.

8. The piezoelectric driving device according to claim 1, wherein the lower layer wire is connected to a ground.

9. The piezoelectric driving device according to claim 1, wherein
the substrate includes vibrating sections and supporting sections configured to support the vibrating sections, and
the piezoelectric element for driving and the piezoelectric element for detection are respectively disposed in the vibrating sections.

10. A piezoelectric motor comprising:
the piezoelectric driving device according to claim 1; and
a driven section that is in contact with the piezoelectric driving device.

11. A piezoelectric motor comprising:
the piezoelectric driving device according to claim 2; and
a driven section that is in contact with the piezoelectric driving device.

12. A piezoelectric motor comprising:
the piezoelectric driving device according to claim 3; and
a driven section that is in contact with the piezoelectric driving device.

13. A robot comprising the piezoelectric driving device according to claim 1.

14. A robot comprising the piezoelectric driving device according to claim 2.

15. An electronic-component conveying apparatus comprising the piezoelectric driving device according to claim 1.

16. An electronic-component conveying apparatus comprising the piezoelectric driving device according to claim 2.

17. A printer comprising the piezoelectric driving device according to claim 1.

18. A printer comprising the piezoelectric driving device according to claim 2.

19. A projector comprising the piezoelectric driving device according to claim 1.

20. A projector comprising the piezoelectric driving device according to claim 2.

* * * * *